US008050786B2

(12) United States Patent
Holzwarth

(10) Patent No.: US 8,050,786 B2
(45) Date of Patent: Nov. 1, 2011

(54) METHOD FOR BUILDING THREE-DIMENSIONAL OBJECTS WITH THIN WALL REGIONS

(75) Inventor: Donald J. Holzwarth, Minnetonka, MN (US)

(73) Assignee: Stratasys, Inc., Eden Prairie, MN (US)

( * ) Notice: Subject to any disclaimer, the term of this patent is extended or adjusted under 35 U.S.C. 154(b) by 1146 days.

(21) Appl. No.: 11/827,183

(22) Filed: Jul. 11, 2007

(65) Prior Publication Data

US 2009/0018685 A1    Jan. 15, 2009

(51) Int. Cl.
G06F 19/00    (2011.01)
(52) U.S. Cl. ........... 700/98; 700/118; 700/119; 700/184
(58) Field of Classification Search .................. 700/97, 700/98, 118, 119, 120, 182, 184, 186; 703/1, 703/6; 264/308, 401
See application file for complete search history.

(56) References Cited

U.S. PATENT DOCUMENTS

| | | |
|---|---|---|
| 4,575,330 A | 3/1986 | Hull |
| 4,665,492 A | 5/1987 | Masters |
| 4,749,347 A | 6/1988 | Valavaara |
| 4,961,154 A | 10/1990 | Pomerantz et al. |
| 5,059,266 A | 10/1991 | Yamane et al. |
| 5,121,329 A | 6/1992 | Crump |
| 5,134,569 A | 7/1992 | Masters |
| 5,136,515 A | 8/1992 | Helinski |
| 5,140,937 A | 8/1992 | Yamane et al. |
| 5,149,548 A | 9/1992 | Yamane et al. |
| 5,169,081 A | 12/1992 | Goedderz |
| 5,204,055 A | 4/1993 | Sachs et al. |
| 5,208,763 A | 5/1993 | Hong et al. |
| 5,216,616 A | 6/1993 | Masters |
| 5,257,657 A | 11/1993 | Gore |
| 5,263,130 A | 11/1993 | Pomerantz et al. |
| 5,303,141 A | 4/1994 | Batchelder et al. |
| 5,325,472 A | 6/1994 | Horiuchi et al. |
| 5,340,433 A | 8/1994 | Crump |
| 5,402,351 A | 3/1995 | Batchelder et al. |
| 5,426,722 A | 6/1995 | Batchelder |
| 5,474,719 A | 12/1995 | Fan et al. |

(Continued)

FOREIGN PATENT DOCUMENTS

JP    60-168615 A    9/1985

(Continued)

OTHER PUBLICATIONS

Kodama, "Automatic Method for Fabricating a Three-Dimensional Plastic Model with Photo-Hardening Polymer", Rev. Sci. Instrum. 52(11), Nov. 1981.

(Continued)

Primary Examiner — Charles Kasenge
(74) Attorney, Agent, or Firm — Brian R. Morrison; Westman, Champlin & Kelly, P.A.

(57) ABSTRACT

A method for modifying a computer-aided design model of a three-dimensional object, the method comprising establishing a threshold wall width, providing at least one sliced layer polyline of the computer-aided design model, determining a first distance between first and second portions of the at least one sliced layer polyline, and adjusting locations of the first and second portion to provide a second distance if the first distance is less than the threshold wall width, where the second distance is about equal to the threshold wall width, or greater.

20 Claims, 21 Drawing Sheets

U.S. PATENT DOCUMENTS

| | | |
|---|---|---|
| 5,491,643 A | 2/1996 | Batchelder |
| 5,503,785 A | 4/1996 | Crump et al. |
| 5,557,714 A | 9/1996 | Lines et al. |
| 5,587,913 A | 12/1996 | Abrams et al. |
| 5,594,652 A | 1/1997 | Penn et al. |
| 5,653,925 A | 8/1997 | Batchelder |
| 5,695,707 A | 12/1997 | Almquist et al. |
| 5,701,403 A | 12/1997 | Watanabe et al. |
| 5,738,817 A | 4/1998 | Danforth et al. |
| 5,764,521 A | 6/1998 | Batchelder et al. |
| 5,807,437 A | 9/1998 | Sachs et al. |
| 5,866,058 A | 2/1999 | Batchelder et al. |
| 5,900,207 A | 5/1999 | Danforth et al. |
| 5,939,008 A | 8/1999 | Comb et al. |
| 5,943,235 A | 8/1999 | Earl et al. |
| 5,968,561 A | 10/1999 | Batchelder et al. |
| 6,004,124 A | 12/1999 | Swanson et al. |
| 6,022,207 A | 2/2000 | Dahlin et al. |
| 6,028,410 A | 2/2000 | Leavitt et al. |
| 6,054,077 A | 4/2000 | Comb et al. |
| 6,067,480 A | 5/2000 | Stuffle et al. |
| 6,073,056 A | 6/2000 | Gawronski et al. |
| 6,085,957 A | 7/2000 | Zinniel et al. |
| 6,112,109 A | 8/2000 | D'Urso |
| 6,129,872 A | 10/2000 | Jang |
| 6,133,355 A | 10/2000 | Leyden et al. |
| 6,162,378 A | 12/2000 | Bedal et al. |
| 6,165,406 A | 12/2000 | Jang et al. |
| 6,175,422 B1 | 1/2001 | Penn et al. |
| 6,193,923 B1 | 2/2001 | Leyden et al. |
| 6,214,279 B1 | 4/2001 | Yang et al. |
| 6,228,923 B1 | 5/2001 | Lombardi et al. |
| 6,261,077 B1 | 7/2001 | Bishop et al. |
| 6,323,859 B1 | 11/2001 | Gantt |
| 6,367,791 B1 | 4/2002 | Calderon et al. |
| 6,490,496 B1 | 12/2002 | Dacey |
| 6,532,394 B1 | 3/2003 | Earl et al. ............ 438/659 |
| 6,572,807 B1 | 6/2003 | Fong |
| 6,600,965 B1 | 7/2003 | Hull et al. |
| 6,629,011 B1 | 9/2003 | Calderon et al. |
| 6,645,412 B2 | 11/2003 | Priedeman, Jr. et al. |
| 6,685,866 B2 | 2/2004 | Swanson et al. |
| 6,722,872 B1 | 4/2004 | Swanson et al. |
| 6,730,252 B1 | 5/2004 | Teoh et al. |
| 6,788,984 B2 * | 9/2004 | Plotkin ............ 700/98 |
| 6,813,594 B2 | 11/2004 | Guertin et al. |
| 6,814,907 B1 | 11/2004 | Comb |
| 6,823,230 B1 | 11/2004 | Jamalabad et al. |
| 6,898,477 B2 | 5/2005 | Loughran |
| 6,907,307 B2 | 6/2005 | Chen et al. |
| 6,936,212 B1 | 8/2005 | Crawford |
| 6,998,087 B1 | 2/2006 | Hanson et al. |
| 7,024,272 B2 | 4/2006 | Thomas et al. |
| 7,184,044 B2 | 2/2007 | Chin et al. |
| 2002/0009223 A1 | 1/2002 | Wong |
| 2002/0011693 A1 | 1/2002 | Leyden et al. |
| 2002/0149137 A1 | 10/2002 | Jang et al. |
| 2003/0076371 A1 | 4/2003 | Fong |
| 2004/0006405 A1 | 1/2004 | Chen et al. |
| 2004/0075196 A1 | 4/2004 | Leyden et al. |
| 2005/0103360 A1 | 5/2005 | Tafoya |
| 2006/0001190 A1 | 1/2006 | Priedeman, Jr. et al. |
| 2006/0025971 A1 | 2/2006 | Detwiler et al. |
| 2006/0106485 A1 | 5/2006 | Landers et al. |
| 2006/0155418 A1 | 7/2006 | Bradbury et al. |
| 2007/0233298 A1 | 10/2007 | Heide et al. |

FOREIGN PATENT DOCUMENTS

JP    63-141725 A    6/1988

OTHER PUBLICATIONS

T. Wohlers, "CAD Meets Rapid Prototyping", from Computer-Aided Engineering, vol. 11, No. 4, pp. 1-4 (Apr. 1992).

T. Wohlers, "The World of Rapid Prototyping", from Proceedings of the Fourth Int'l. Conf. on Desktop Manufacturing, pp. 1-9 (Sep. 24-25, 1992).

T. Wholers, Installing a Rapid Prototyping System—The Economic and Organizational Issues, pp. 1-5 (1991).

T. Wholers, "Rapid Prototyping: An Update on RP Applications Technology Improvements, and Developments in the Industry" pp. 1-6 (1991).

T. Wholers, "Chrysler Compares Rapid Prototyping Systems", from Computer-Aided Engineering, vol. 11, No. 10, pp. 1-5 (Oct. 1992).

International Search Report and Written Opinion of Foreign Application No. PCT/US08/08547, dated Oct. 1, 2008.

Office Action from counterpart Chinese Patent Application No. 200880023798.4, dated Apr. 13, 2011.

* cited by examiner

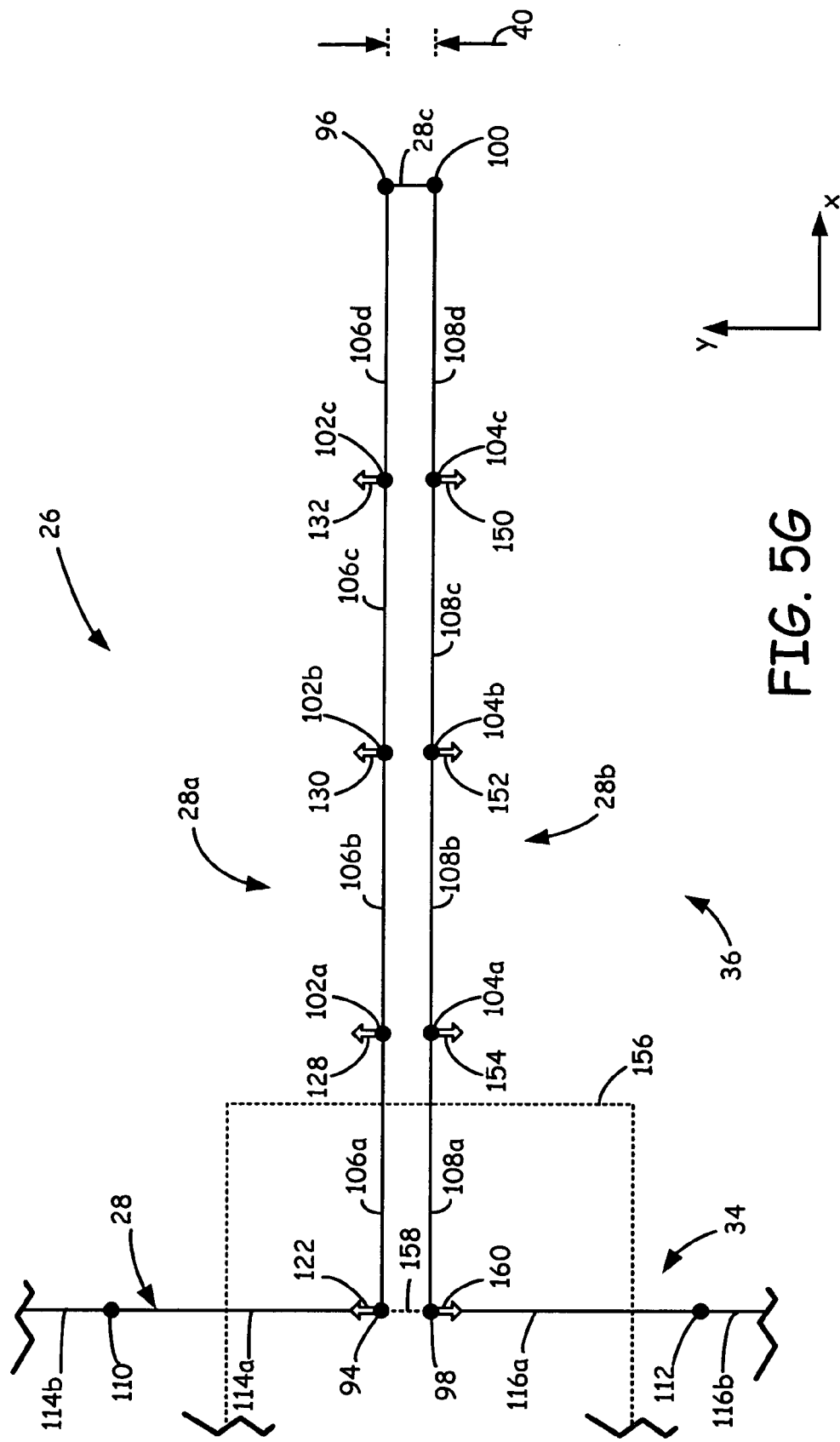

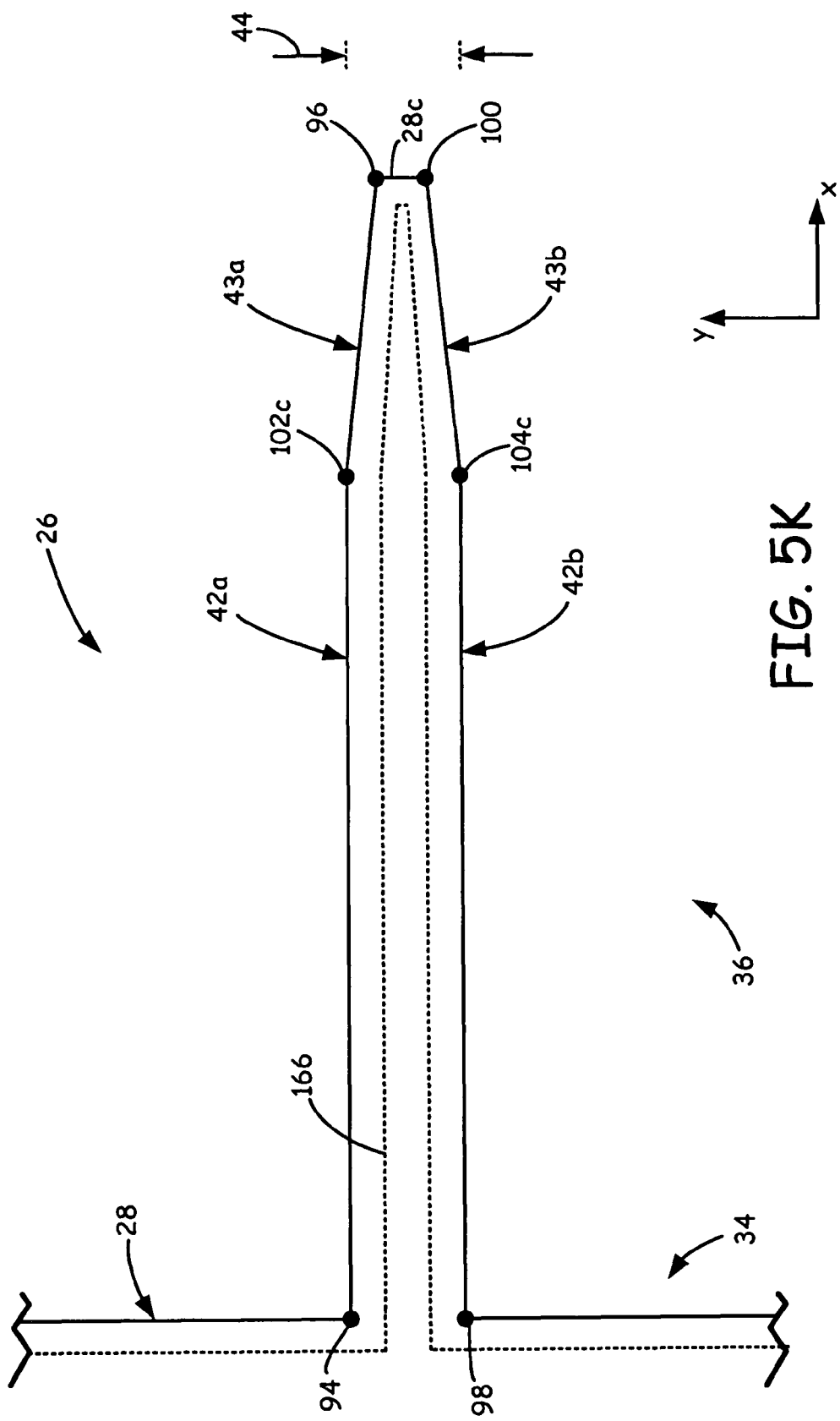

METHOD FOR BUILDING THREE-DIMENSIONAL OBJECTS WITH THIN WALL REGIONS

BACKGROUND

The present invention relates to the fabrication of three-dimensional (3D) objects from computer-aided design (CAD) models using layered deposition systems. In particular, the present invention relates to methods for modifying the geometries of thin-wall regions of CAD models.

A layered deposition system is used to build a 3D object from a CAD model (e.g., STL data) in a layer-by-layer manner by depositing a flowable build material onto a substrate in an x-y plane. The build material is deposited as a sequence of roads from a movable deposition head, where the deposited roads solidify to previously deposited build material. The position of the deposition head relative to the substrate is then incremented along a z-axis (perpendicular to the x-y plane), and the process is repeated multiple times to form a 3D object resembling the CAD model.

Movement of the deposition head with respect to the substrate is performed under computer control, in accordance with build data that represents the 3D object. The build data is obtained by slicing the CAD model of the 3D object into multiple horizontally sliced layers. Each sliced layer typically includes one or more polylines that define the geometry of the sliced layer. Each polyline is defined by multiple primary vertices interconnected with linear segments, where each primary vertex is a coordinate point in the x-y plane that represents a point of angular deflection between a pair of the linear segments. Based on the polylines, the host computer then generates one or more tool paths for depositing roads of build material for each sliced layer.

CAD models are typically capable of describing the geometries of 3D objects in greater detail than what layered deposition systems are capable of reproducing. As a result, CAD models may include geometries that create undesirable results, such as overfill conditions, during build operations. One particular geometry that may result in an overfill condition is a thin-wall region, where the wall thickness of the 3D object falls within a range that is greater than the width of a single tool path, but is less than the combined widths of a pair of adjacent tool paths. As such, there is a need for techniques to modify the geometries of thin-wall regions to reduce the risk of creating overfill conditions when building 3D objects with layered deposition systems.

SUMMARY

The present invention relates to a method for modifying a CAD model of a three-dimensional object. The method includes establishing a threshold wall width and providing at least one polyline of a sliced layer of the CAD model, where the at least one polyline includes a first portion and a second portion. The method also includes determining a first distance between the first and second portions, and adjusting locations of the first and second portions to provide a second distance between the first and second portions if the first distance is less than the threshold wall width, where the second distance is about equal to the threshold wall width, or greater.

BRIEF DESCRIPTION OF THE DRAWINGS

FIGS. 5A-5K are schematic views of a thin-wall region of the sliced layer shown in FIG. 2, which illustrate the operation of the method shown in FIG. 4 for modifying the geometry of a polyline.

DETAILED DESCRIPTION

Figure 1:
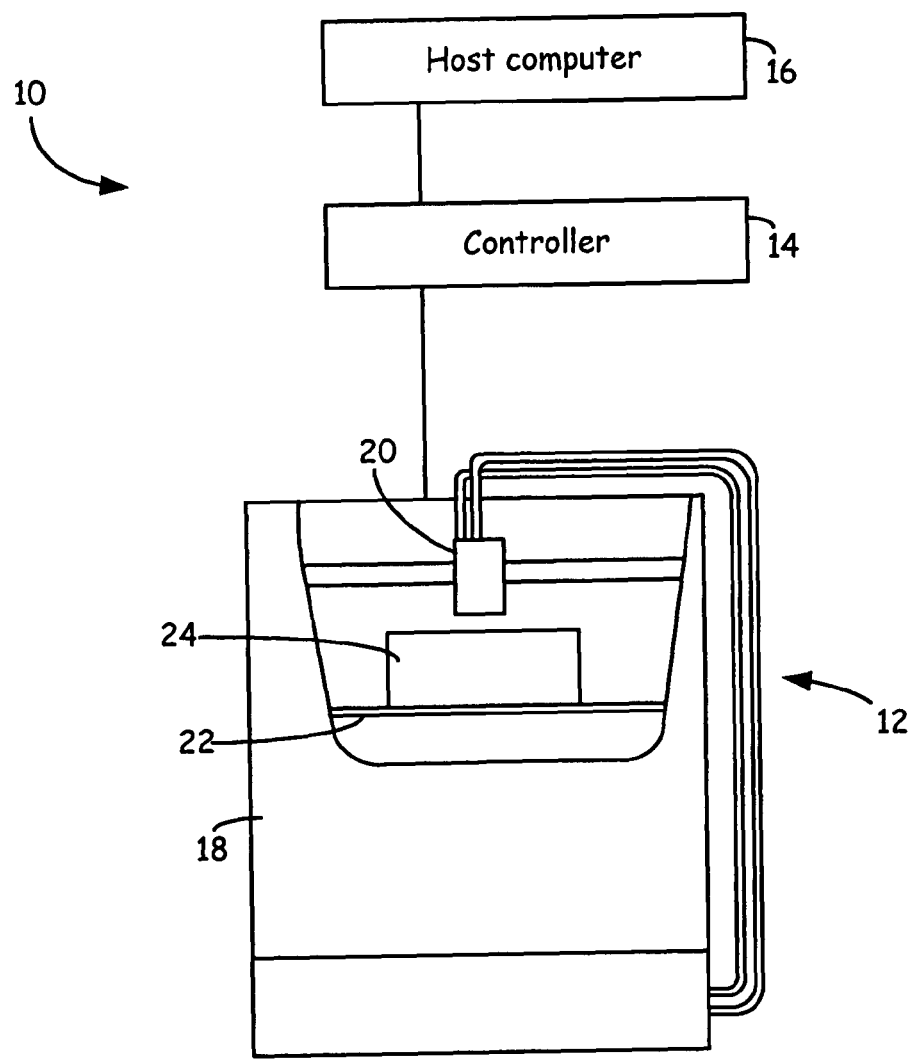
FIG. 1 is a front view of an assembly for building 3D objects pursuant to the present invention.

FIG. 1 is a front view of assembly 10 for building 3D objects pursuant to the present invention. Assembly 10 includes layered deposition system 12, controller 14, and host computer 16, where layered deposition system 12 is a system for building 3D objects with a layered deposition technique. Suitable systems for layered deposition system 12 include systems that deposit roads of build material to build a 3D object in a layer-by-layer manner, such as extrusion-based layered deposition systems (e.g., fused deposition modeling systems developed by Stratasys, Inc., Eden Prairie, Minn.).

As shown, layered deposition system 12 includes build chamber 18, deposition head 20, and substrate 22. Build chamber 18 is a build environment that contains deposition head 20 and substrate 22 for building a 3D object (referred to as 3D object 24) with a supplied build material. Controller 14 directs the motion of deposition head 20 and substrate 22 based on build data supplied by host computer 16. Controller 14 also directs the deposition pattern of deposition head 20 to selectively deposit the build material (and support material), thereby building 3D object 24 (and any accompanying support structure) on substrate 22.

Host computer 16 is a computer-based system that interacts with layered deposition system 12 via controller 14 to build 3D object 24. Host computer 16 generates the build data from a CAD model (not shown) corresponding to 3D object 24, and relays the build data to controller 14. In many situations, the CAD model may have a geometry that has greater detail than what layered deposition system 12 is capable of reproducing (e.g., one or more thin-wall regions). This may increase the risk of overfilling the corresponding portions of 3D object 24 during a build operation. However, as discussed below, host computer 16 modifies the geometry of the CAD model pursuant to the present invention to reduce the risk of creating overfill conditions.

For ease of discussion, the following description of the present invention is made with reference to the components of assembly 10 (e.g., host computer 16). However, the present invention is not intended to be limited to the particular arrangement of assembly 10, and may be performed with a variety of different computer-based systems and layered deposition systems. For example, host computer 16 may alternatively be one or more remotely-located computer systems that modify the geometry of the CAD model. In this embodiment, the resulting build data is then provided from host computer 16 to a second computer system (not shown) that communicates with layered deposition system 12 via controller 14. Furthermore, it is understood that the geometric shape of object 24 is merely exemplary, and that the present invention is suitable for use with CAD models and 3D objects having a variety of different geometric designs.

Figure 2:
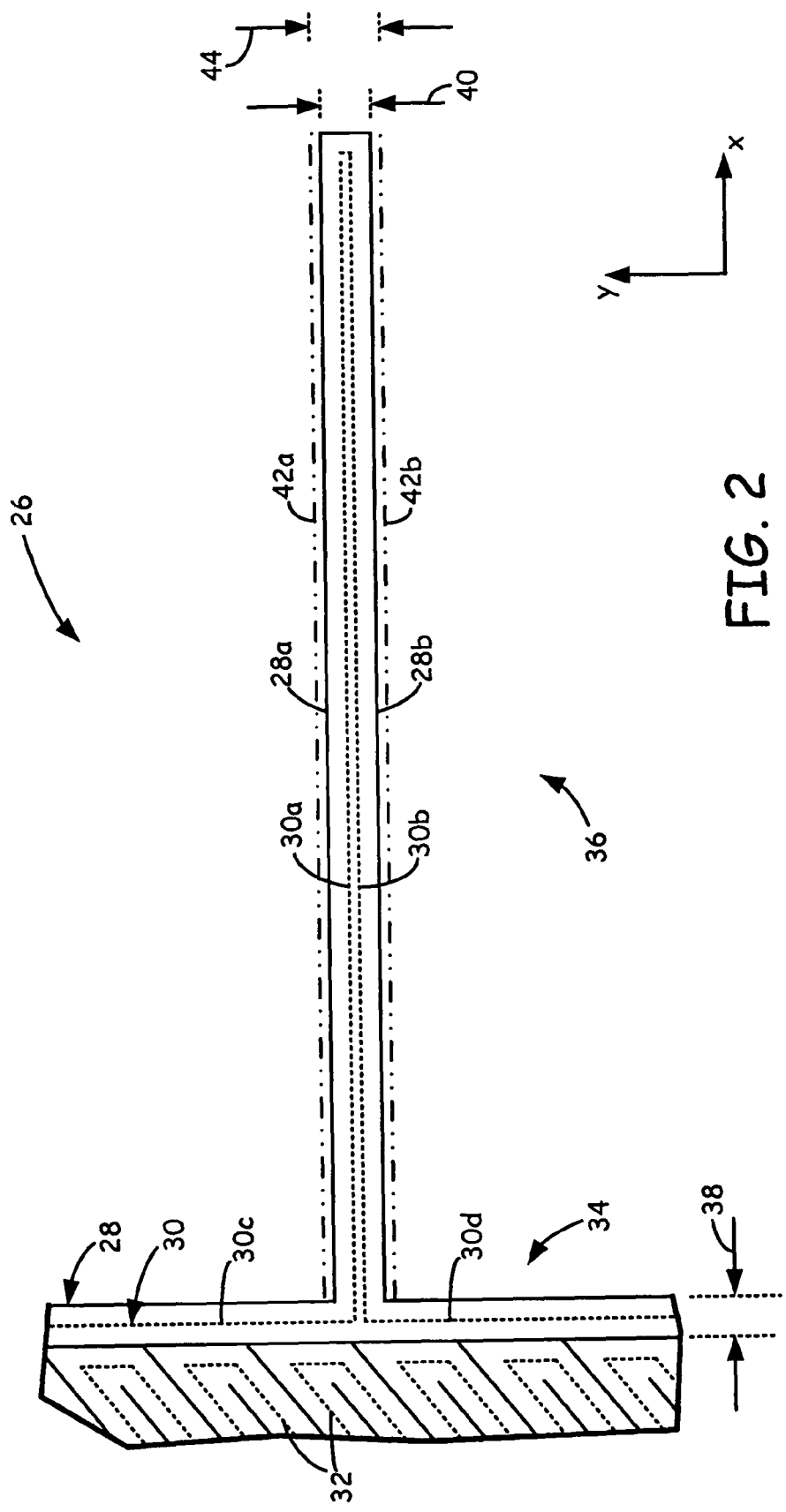
FIG. 2 is a schematic view of a sliced layer of a CAD model having a thin-wall region.

FIG. 2 is a schematic view of layer 26, which is a sliced layer of a CAD model generated by host computer 16 (shown in FIG. 1), where the CAD model corresponds to 3D object 24 (shown in FIG. 1) to be built with layered deposition system 12 (shown in FIG. 1). Layer 26 includes polyline 28, perimeter tool path 30, and raster tool path 32. Polyline 28 is a perimeter geometry disposed in an x-y plane, which defines the exterior surface of 3D object 24 at layer 26. The region within polyline 28 is the portion of layer 26 that will be filled with build material during a build operation, and is divided into bulk region 34 and thin-wall region 36.

After the CAD model is sliced into multiple layers (e.g., layer 26) and polyline 28 is identified, host computer 16 generates perimeter tool path 30 and raster tool path 32 for layer 26. Perimeter tool path 30 and raster tool path 32 define the deposition patterns that deposition head 20 (shown in FIG. 1) will follow while depositing build material. Perimeter tool path 30 and raster tool path 32 are generated based on road width 38, which is the predicted width of a deposited road of build material from layered deposition system 12. Road width 38 may depend on a variety of factors, such as build material properties, the type of layered deposition system used, deposition conditions, deposition tip dimensions, and combinations thereof. For example, suitable widths for road width 38 for a fused deposition modeling system range from about 250 micrometers (about 10 mils) to about 510 micrometers (about 20 mils).

Perimeter tool path 30 is generated at an interior offset location relative to polyline 28, which is at a distance of about one-half of road width 38. Perimeter tool path 30 is subdivided into sub-paths 30a-30d, where tool sub-paths 30a and 30b are located at thin-wall region 36, and sub-paths 30c and 30d are located at bulk region 34. Sub-paths 30c and 30d define the perimeter of bulk region 34 as single tool paths having widths equal to road width 38. Raster tool path 32 is then generated at an interior offset location relative to sub-paths 30c and 30d, thereby filling bulk region 34. As shown, sub-paths 30c and 30d and raster tool path 32 may be generated with sufficient room to substantially fill bulk region 34 without any tool path overlapping. Accordingly, bulk region 34 provides a minimal risk of overfilling when layered deposition system 12 deposits roads of build material based on sub-paths 30c and 30d and raster tool path 32.

In comparison, sub-paths 30a and 30b define a perimeter of thin-wall region 36 with a wrap-around arrangement, where a pair of tool sub-paths (i.e., sub-paths 30a and 30b) are generated adjacent to each other. If the wall width of thin-wall region 36 is double the width of road width 38, then sub-paths 30a and 30b may be generated with sufficient room to substantially fill thin-wall region 36 without any tool path overlapping. However, the parallel segments of polyline 28 at thin-wall region 36 (referred to as segments 28a and 28b) are separated by wall width 40 along the y-axis, where wall width 40 falls in a range that is greater than road width 38 (i.e., greater than a single road of build material), but is less than twice of road width 38 (i.e., less than a pair of adjacent roads of build material). As such, when perimeter tool path 30 is generated with the wrap-around arrangement at thin-wall region 36, sub-paths 30a and 30b overlap. This overlapping may cause the deposited roads of build material to overfill the corresponding region of 3D object 24, thereby resulting in poor part quality and potentially damaging deposition head 20.

One technique for reducing the risk of creating an overfill condition involves removing one of the overlapping tool paths (e.g., removing sub-path 30b). This eliminates any overlapping of sub-paths 30a and 30b. However, the removal of one of the tool paths reduces the wall width of thin-wall region 36 to road width 38, thereby reducing the strength of thin-wall region 36. Pursuant to the present invention, however, the geometry of thin-wall region 36 may be modified to reduce the risk of creating an overfill condition at thin-wall region 36. In particular, segments 28a and 28b of polyline 28 may be adjusted to the locations of adjusted segments 42a and 42b (shown with phantom lines) such that an adjusted wall width at thin-wall region 36 (referred to as adjusted wall width 44) is about equal to a "threshold wall width", or greater.

Figure 3:
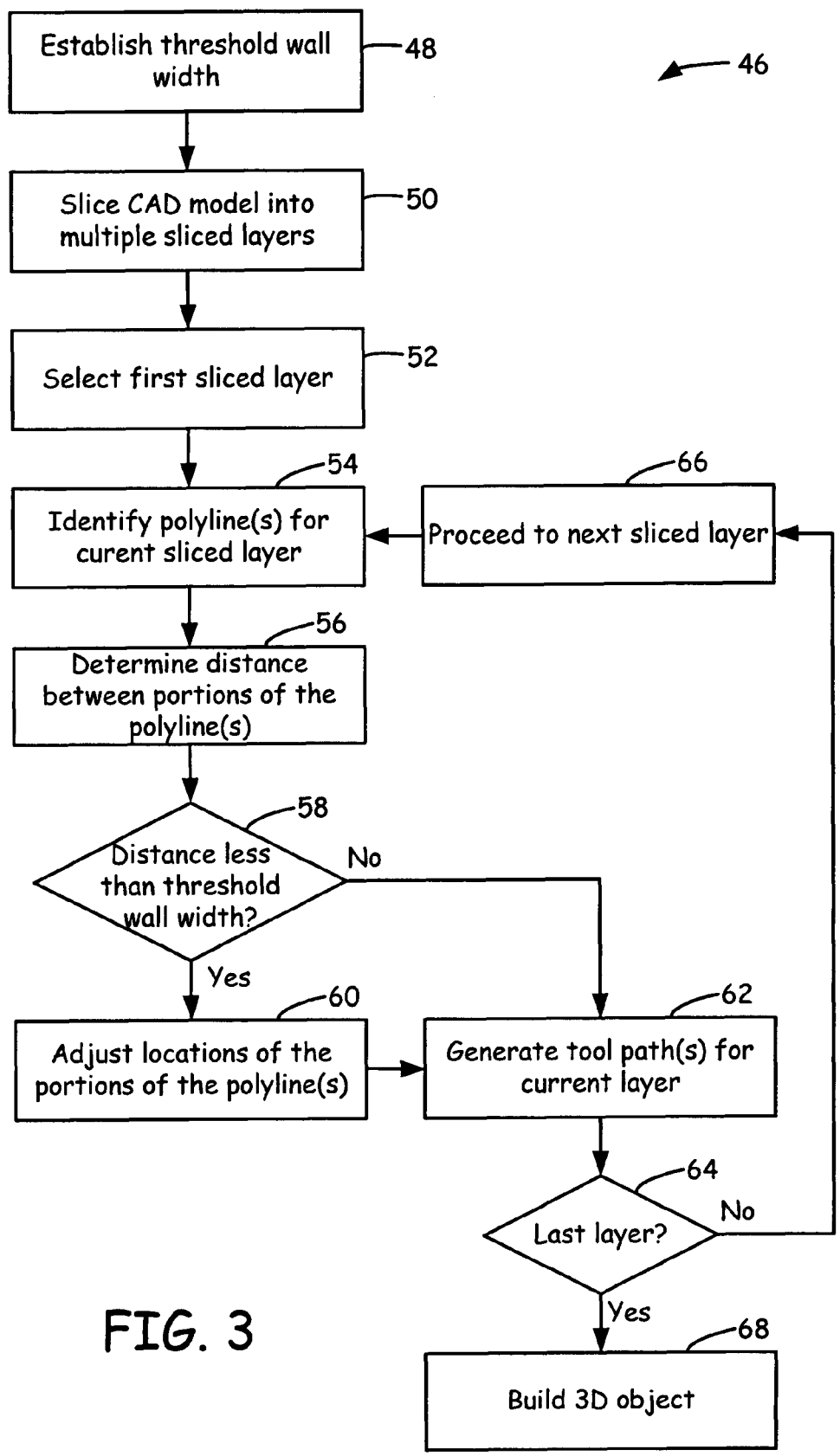
FIG. 3 is a flow diagram of a method for building a 3D object from a CAD model pursuant to the present invention.

FIG. 3 is a flow diagram of method 46 for building a 3D object (e.g., 3D object 24, shown in FIG. 1) from a CAD model having at least one thin-wall region (e.g., thin-wall region 36, shown in FIG. 2). Method 46 includes steps 48-68, and initially involves establishing the "threshold wall width" for a layered deposition system (e.g., layered deposition system 12, shown in FIG. 1) (step 48). In this embodiment, the threshold wall width is the minimum wall width at which a pair of adjacent roads of build material can be deposited without substantially overfilling, and is based on the predicted road width of build material deposited from the layered deposition system (e.g., road width 38, shown in FIG. 2).

As discussed above, a wall width that is equal to double the road width is capable of being built with a pair of adjacent roads of build material without any overlapping. As such, a polyline with this wall width does not require any geometric modification. Thus, in one embodiment, the threshold wall width is about 200% of the road width, or less. Depending on the layered deposition system and build conditions, wall widths down to about 150% of the road width may also be used without creating substantial overfill conditions. However, below about 150% of the road width, the overlapping roads of deposited build material begin to substantially overfill the corresponding region of the 3D object. Accordingly, examples of suitable threshold wall widths range from about 150% of the road width to about 200% of the road width, with particularly suitable threshold wall widths ranging from about 160% of the road width to about 180% of the road width. For example, for a fused deposition modeling system configured to deposit a build material with a road width of about 510 micrometers (about 20 mils), a suitable threshold wall width is about 860 micrometers (about 34 mils) (i.e., about 170% of the road width).

Once the threshold wall width is established, host computer 16 (shown in FIG. 1) may modify the geometries of thin-wall regions (e.g., thin-wall region 36) based on the threshold wall width to reduce the risk of creating overfill conditions. The threshold wall width may also be used as a predefined value that a variety of subsequent computations are based on. This allows the computations to change with changes in the threshold wall width, thereby allowing method 46 to be performed with a variety of different layered deposition systems and build conditions. For the following discussion regarding layer 26, the threshold wall width for layered deposition system 12 is assumed to be 170% of road width 38.

The CAD model is then sliced into multiple sliced layers (e.g., layer 26), where each sliced layer includes one or more polylines (step 50). Host computer 16 then selects a first sliced layer to analyze (step 52), and identifies the coordinates of the polyline(s) of the selected sliced layer (step 54). The identified polyline(s) is then analyzed to determine the distance between adjacent portions of the polyline(s) (e.g., segments 28a and 28b, shown in FIG. 2) (step 56). In alternative embodiments, the determination of the threshold wall width in step 48 may be performed after one or more of steps 50-56 for the first selected sliced layer.

Host computer 16 then determines whether the distance between the adjacent portions is less than the threshold wall width (step 58). In the current example for layer 26, the threshold wall width for layered deposition system 12 is 170% of road width 38. In comparison, wall width 40 (shown in FIG. 2) is about 125% of road width 38, which is less than the threshold wall width. As such, host computer 16 then adjusts the locations of the adjacent portions of the polyline(s) such that an adjusted wall width between the portions is about equal to the threshold wall width, or greater (step 60). For the example shown in FIG. 2, step 60 involves adjusting the locations of segments 28a and 28b to the locations of adjusted segments 42a and 42b (shown in FIG. 2), where adjusted wall width 44 (shown in FIG. 2) between adjusted segments 42a and 42b is about equal to the threshold wall width, or greater.

Host computer 16 then generates one or more perimeter tool paths for the current sliced layer based on the polyline(s) with the adjusted portions (step 62). Raster tool paths (e.g., raster tool path 32, shown in FIG. 2) may also be generated to fill in bulk regions (e.g., bulk region 34, shown in FIG. 2). Host computer 16 then determines whether the current sliced layer is the last sliced layer of the CAD model to be analyzed for thin-wall geometries (step 64). If not, host computer 16 proceeds to the next sliced layer of the CAD model (step 66), and repeats steps 54-62 for each remaining sliced layer. This modifies the geometries of thin-wall regions in each sliced layer of the CAD model. When the last sliced layer is analyzed (step 64), host computer 16 then relays the corresponding build data to controller 14 (shown in FIG. 1) to build 3D object 24 with layered deposition system 12 (step 68). Because the portions of the polyline(s) for each sliced layer are separated by distances about equal to the threshold wall width (or greater), the roads of build material are deposited without substantially overfilling the corresponding regions of 3D object 24. This preserves the quality of 3D object 24, and reduces the risk of damaging deposition head 20.

Figure 4:
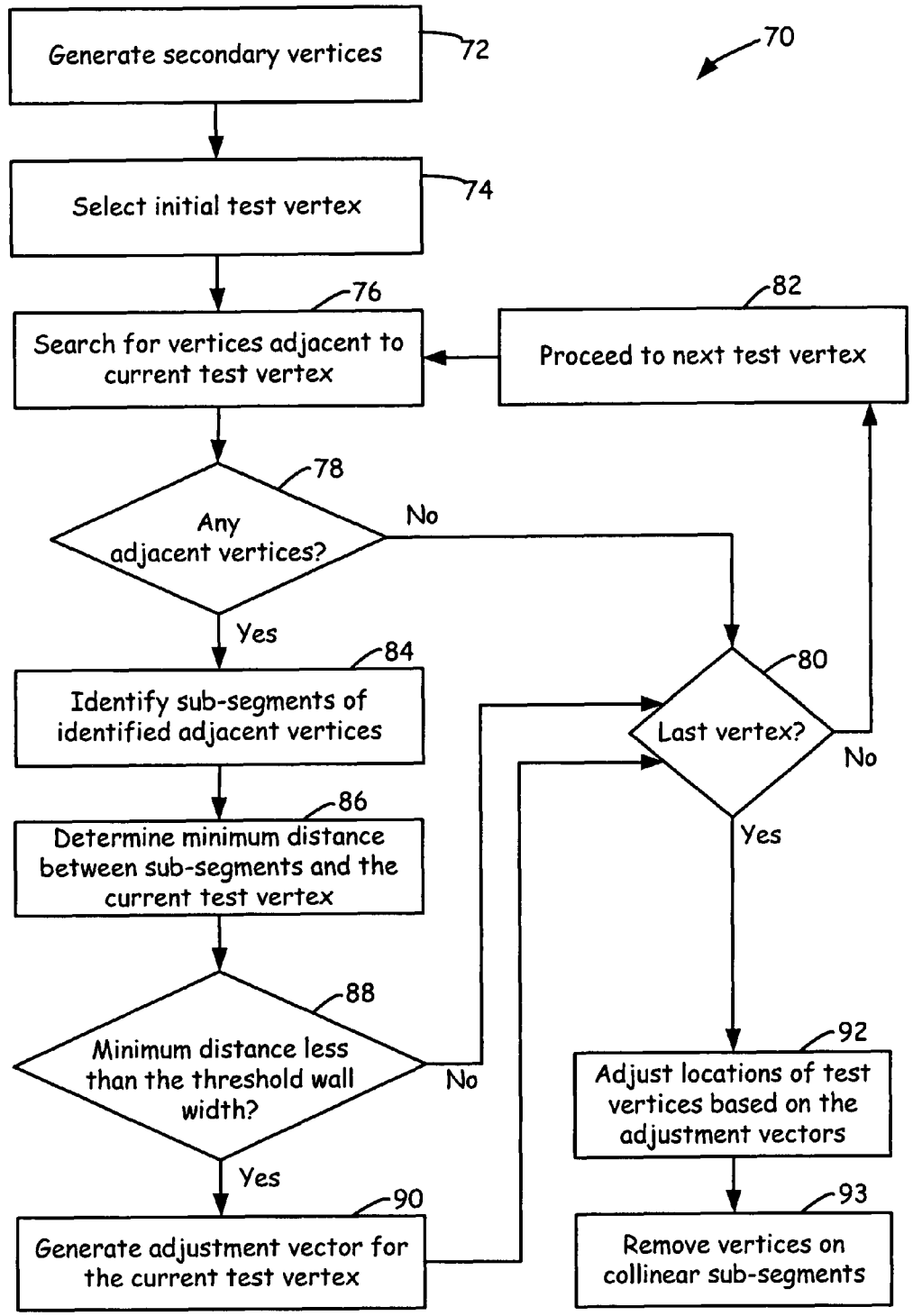
FIG. 4 is a flow diagram of a method for modifying the geometry of a polyline containing a thin-wall region that creates a potential overfill condition.

FIGS. 4 and 5A-5K illustrate a suitable technique for performing steps 56-60 of method 46 (shown in FIG. 3) to modify the geometry of a polyline containing a thin-wall region. FIG. 4 is a flow diagram of method 70, which includes steps 72-93, and initially involves generating secondary vertices along the polyline (e.g., polyline 28 shown in FIG. 1) (step 72). As discussed above, a polyline generated from a sliced layer of a CAD model includes multiple linear segments that are interconnected at primary vertices, where each primary vertex represents a point of angular deflection between a pair of linear segments. Pursuant to step 72, host computer 16 (shown in FIG. 1) generates additional secondary vertices that are collinear along the linear segments. The secondary vertices divide the linear segments of the polyline into sub-segments, and provide potential points for modifying the geometry of the polyline.

Host computer 16 then selects an initial test vertex from the series of primary and secondary vertices (step 74), and searches for additional vertices that are adjacent to the test vertex (step 76). These adjacent vertices may indicate potential overfill conditions. If no adjacent vertices are found (step 78), host computer 16 then determines whether the current test vertex is the last vertex in the series along the polyline (step 80). If not, host computer 16 then proceeds to the next vertex in the series (step 82) and searches for additional vertices that are adjacent to this next test vertex (step 76). If adjacent vertices are found (step 78), host computer 16 then identifies the sub-segments located on each side of the adjacent vertices (step 84), and determines the minimum distance between the identified sub-segments and the current test vertex (step 86).

Host computer 16 then determines whether the minimum distance between the identified sub-segments and the current test vertex is less than the threshold wall width (step 88). If not, then host computer 16 determines whether the current test vertex is the last vertex in the series along the polyline (step 80), as discussed above. However, if the minimum distance between the identified sub-segments and the current test vertex is less than the threshold wall width, host computer 16 then generates an "adjustment vector" for the current test vertex (step 90). As discussed below, the adjustment vector allows the location of the current test vertex (and accompanying polyline sub-segments) to be adjusted. After the adjustment vector is generated, host computer 16 determines whether the current test vertex is the last vertex in the series along the polyline (step 80), as discussed above.

Steps 76-82 are then repeated until each vertex in the series along the polyline is analyzed. When the last vertex in the series is analyzed, host computer 16 then adjusts the locations of the test vertices based on the generated adjustment vectors (step 92). If no adjustment vector is generated for a given vertex, the location of the vertex is not adjusted. The adjustments of the locations of the vertices correspondingly adjusts the locations of the segments of the polyline (pursuant to step 60 of method 46). After the locations of the test vertices are adjusted, any vertices disposed on collinear sub-segments are then removed to reduce the number of data coordinates required for the build data (step 93).

Figure 5A:
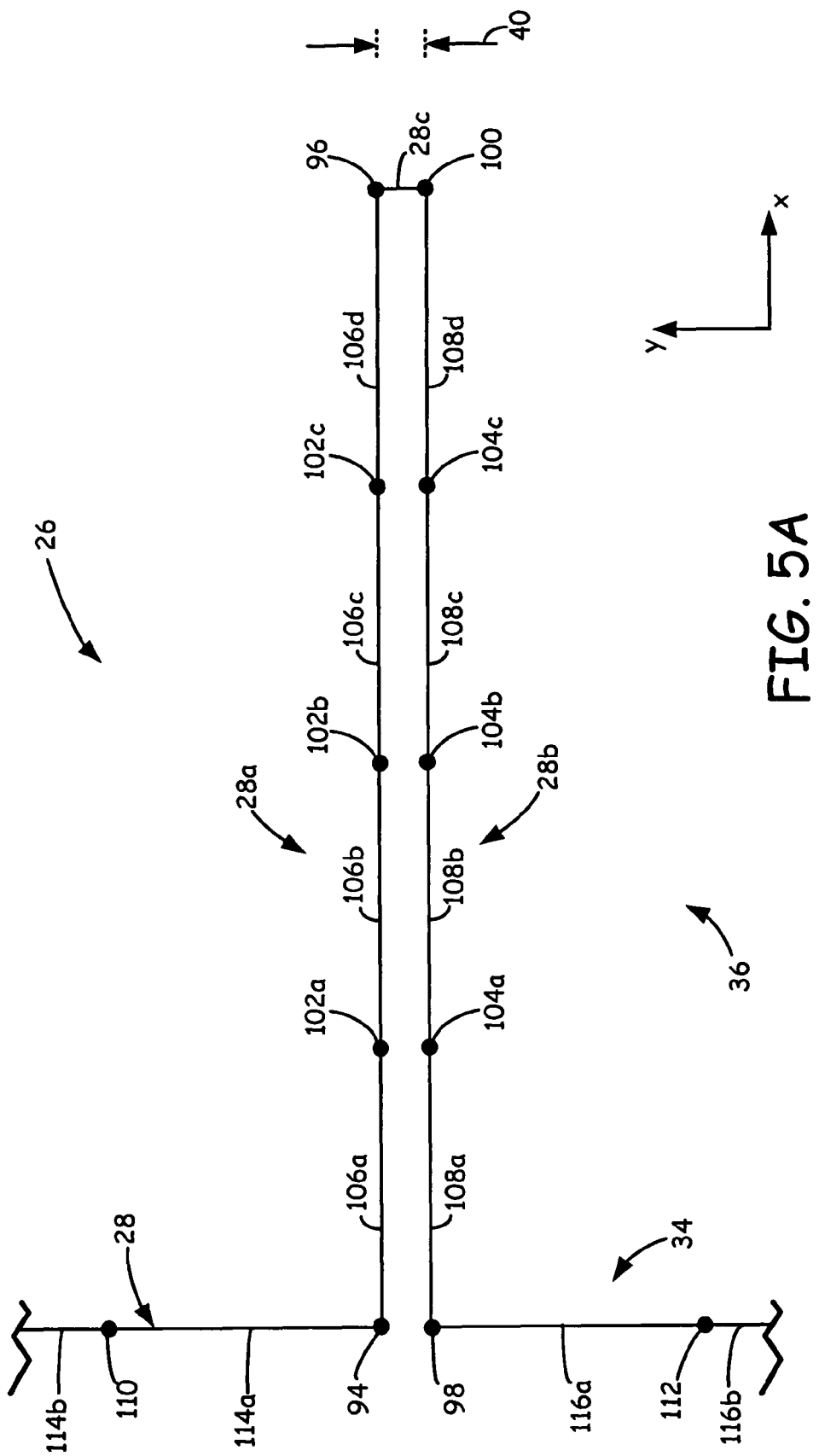

FIGS. 5A-5K are schematic views of thin-wall region 36 (shown in FIG. 2), which illustrate the application of method 70 (shown in FIG. 4) to layer 26. As shown in FIG. 5A, polyline 28 includes primary vertices 94, 96, 98, and 100, each of which is a point of angular deflection of polyline 28. Accordingly, segment 28a is disposed between primary vertices 94 and 96, segment 28b is disposed between primary vertices 98 and 100, and segment 28c is disposed between primary vertices 96 and 100.

Pursuant to step 72 of method 70, host computer 16 (shown in FIG. 1) generates secondary vertices along polyline 28, including secondary vertices 102a-102c along segment 28a, and secondary vertices 104a-104c along segment 28b. This separates segment 28a into sub-segments 106a-106d, and separates segment 28b into sub-segments 108a-108d. Additionally, host computer 16 generates secondary vertices 110 and 112 at bulk region 34, where secondary vertex 110 separates polyline 28 into sub-segments 114a and 114b, and secondary vertex 112 separates polyline 28 into sub-segments 116a and 116b. Similar secondary vertices are generated around the entire perimeter of polyline 28.

The number of secondary vertices generated is desirably based on a predetermined "vertex spacing", which may be derived as a function of the threshold wall width. Examples of suitable vertex spacings range from about 100% of the threshold wall width to about 600% of the threshold wall width, with particularly suitable vertex spacings ranging from about 300% of the threshold wall width to about 600% of the threshold wall width. Vertex spacings less than about 100% of the threshold wall width require substantial amounts of computations, thereby increasing the time required to generate the build data. Conversely, vertex spacings greater than about 600% of the threshold wall width reduce the detail required to adequately modify the geometry of polyline 28.

In one embodiment, secondary vertices 102a-102c are generated by measuring the length of segment 28a, dividing the length by the vertex spacing, and reducing the resulting value to the nearest integer. Similarly, secondary vertices 104a-104c are generated by measuring the length of segment 28b, dividing the length by the vertex spacing, and reducing the resulting value to the nearest integer. In the example shown in FIG. 5A, primary vertices 94 and 96, and secondary vertices 102a-102c are separated by vertex spacings of about 400% of the threshold wall width along segment 28a, and primary vertices 98 and 100, and secondary vertices 104a-104c are separated by vertex spacings of about 400% of the threshold wall width along segment 28b. In comparison, the length of segment 28c is less than 100% of the threshold wall width. As a result, no secondary vertices are generated along segment 28c.

When dividing the length of a segment of polyline 28 (e.g., segment 28a) and reducing the resulting value to the nearest integer, the secondary vertices may occasionally be generated relatively close to the primary vertices. This may result in a substantial distortion of the original geometry of polyline 28 when the vertices are adjusted (pursuant to step 92 of method 70). As a result, in a preferred embodiment, secondary vertices are not generated within a certain distance from the primary vertices to protect the original geometry of polyline 28. Examples of suitable minimum gaps between primary vertices and secondary vertices along polyline 28 include gaps of at least about 20% of the vertex spacings. Alternatively, the minimum gap between primary vertices and secondary vertices may be measured as a function of the threshold wall width. For the particularly suitable vertex spacings discussed above, examples of suitable minimum gaps between primary vertices and secondary vertices along polyline 28 include gaps of at least about 110% of the threshold wall width.

Figure 5B:
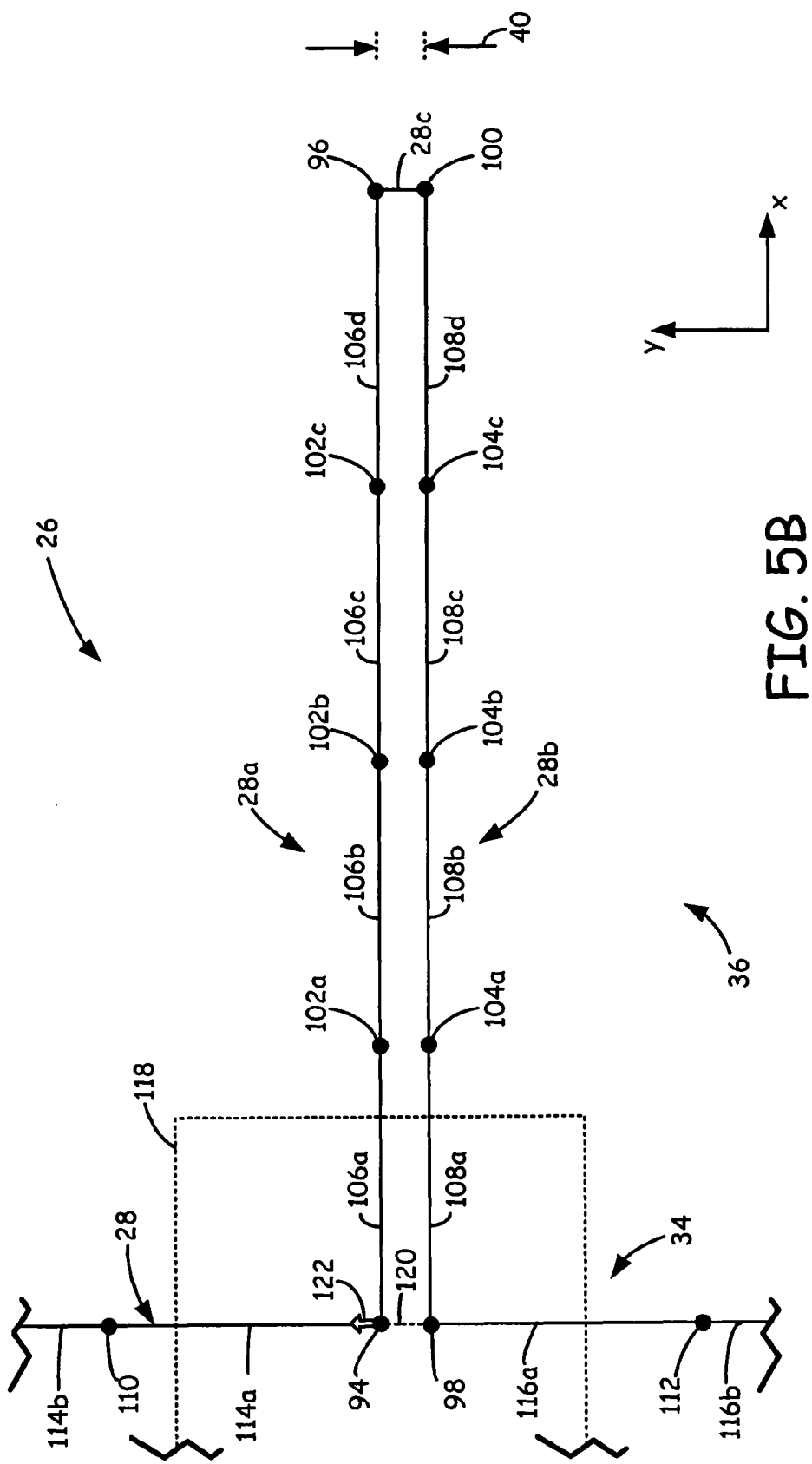

FIG. 5B illustrates thin-wall region 36 after secondary vertices 102a-102c, 104a-104c, 110, and 112 are generated. Pursuant to step 74 of method 70, host computer 16 selects an initial test vertex to analyze. The initial test vertex may be selected from any primary or secondary vertex along polyline 28. As such, for ease of discussion, primary vertex 94 is selected as the initial test vertex in this example. Host computer 16 then searches for additional vertices that are adjacent to primary vertex 94, pursuant to step 76 of method 70. In one embodiment, this is performed by forming test box 118 around primary vertex 94, where text box 118 allows host computer 16 to efficiently flag any vertices that may indicate potential overfill conditions.

The dimensions of test box 118 may vary depending on a desired range of analysis, and may also be calculated as a function of the threshold wall width. Examples of suitable dimensions for test box 118 include wall lengths ranging from about 400% of the threshold wall width to about 800% of the threshold wall width, where the test box is centered around primary vertex 94. In the example shown in FIG. 5B, test box 118 is centered around primary vertex 94 with wall lengths of about 600% of the threshold wall width (i.e., about 300% of the threshold wall width in each direction from primary vertex 94). In alternative embodiments, test box 118 may be replaced with test boxes having different shapes (e.g., circular test boxes centered around primary vertex 94).

Host computer 16 then searches for any additional vertices within test box 118. In one embodiment, host computer 16 ignores any vertices located on the same segment of polyline 28 as the test vertex within a given range (e.g., 210% of the threshold wall width). This limits the selection of vertices to those that are located on adjacent segments. Pursuant to step 78 of method 70, host computer 16 finds primary vertex 98 within test box 118. As a result, host computer 16 then identifies the sub-segments of primary vertex 98, pursuant to step 84 of method 70. Each vertex along polyline 28 is part of a pair of sub-segments that extend between the given vertex and the vertices located on either side of the given vertex. Accordingly, for primary vertex 98, the identified sub-segments are sub-segments 108a and 116a.

The minimum distance between primary vertex 94 (i.e., the current test vertex) and sub-segments 108a and 116a is then determined, pursuant to step 86 of method 70. In the current example, the minimum distance is located directly between primary vertex 94 and primary vertex 98 (represented by line 120). In alternative examples, the current test vertex may be offset from the identified adjacent vertex. In these alternative examples, a point along one of the adjacent sub-segments would provide the minimum distance to the current test vertex.

Pursuant to step 88 of method 70, host computer 16 then determines whether the minimum distance is less than the threshold wall width. In the current example, the distance between primary vertex 94 and primary vertex 98 (along line 120) is equal to wall width 40, which is 125% of road width 38 (shown in FIG. 1). This is less than the threshold wall width, which in this example is 170% of road width 38. As a result, pursuant to step 90 of method 70, host computer 16 generates adjustment vector 122 for primary vertex 94, where adjustment vector 122 extends from primary vertex 94 (i.e., the current test vertex) in a direction that is collinear with line 120 and away from primary vertex 98.

Adjustment vector 122 desirably has a magnitude such that the combined adjusted locations of primary vertices 94 and 98 provide an adjusted distance that is about equal to the threshold wall width, or greater. As discussed below, as method 70 is performed for each vertex along polyline 28, primary vertex 98 will also have an adjustment vector (not shown in FIG. 5B) such that the combined magnitudes of adjustment vector 122 and the adjustment vector of primary vertex 98 position primary vertices 94 and 98 at an adjusted distance that is about equal to the threshold wall width, or greater. Accordingly, in one embodiment, the magnitude for each adjustment vector is calculated by Equation 1:

$$Magnitude_{Adjustment\ vector} \geq \frac{(Threshold\ wall\ width - Minimum\ distance)}{2}.$$

Pursuant to Equation 1, the magnitude of adjustment vector 122 is one-half of the difference between threshold wall width and length of line 120, where the threshold wall width is equal to 170% of road width 38, and the length of line 122 is 125% of road with 38. This results in a magnitude of 22.5% of road width 38. In an alternative embodiment, which reduces the number of computations required by host computer 16, the magnitude for each adjustment vector is set as a predefined value that is as at least about one-half of the threshold wall width.

Figure 5C:
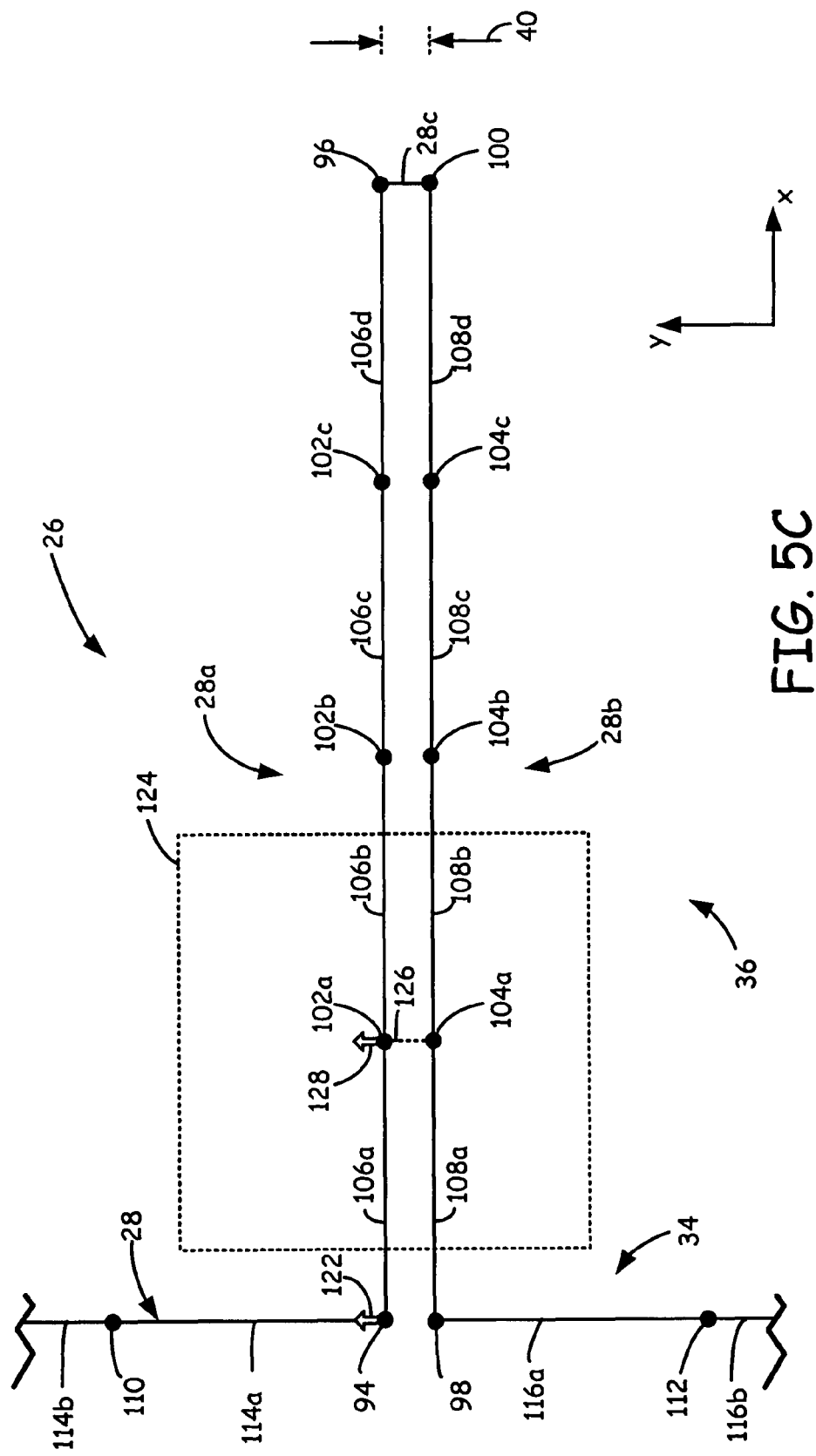

FIG. 5C illustrates thin-wall region 36 after adjustment vector 122 is generated for primary vertex 94. Host computer 16 then determines whether primary vertex 94 is the last vertex along polyline 28, pursuant to step 80 of method 70. Because additional vertices exist along polyline 28 that have not yet been analyzed, the host computer proceeds to the next test vertex, pursuant to step 82 of method 70. In the current example, the next vertex in the series is secondary vertex 102*a*. Host computer 16 then repeats steps 76-90 of method 70 for secondary vertex 102*a* in the same manner as discussed above for primary vertex 94. Accordingly, pursuant to step 76 of method 70, host computer 16 generates test box 124 around secondary vertex 102*a*, and searches for any additional vertices within test box 124. Pursuant to step 78 of method 70, host computer 16 finds secondary vertex 104*a* within test box 124. As a result, pursuant to step 84 of method 70, host computer 16 then identifies sub-segments 108*a* and 108*b* as being adjacent to secondary vertex 104*a*.

Host computer 16 then determines the minimum distance between secondary vertex 102*a* and sub-segments 108*a* and 108*b*, pursuant to step 86 of method 70. In the current example, the minimum distance is located directly between secondary vertex 102*a* and secondary vertex 104*a* (represented by line 126). Pursuant to step 88 of method 70, host computer 16 then determines whether the minimum distance is less than the threshold wall width. In the current example, the distance between secondary vertex 102*a* and secondary vertex 104*a* is also equal to wall width 40, which, as discussed above, is less than the threshold wall width. As a result, host computer 16 generates adjustment vector 128 for secondary vertex 102*a*, where adjustment vector 128 extends from secondary vertex 102*a* in a direction that is substantially collinear with line 126 and away from secondary vertex 104*a*. Because segments 28*a* and 28*b* are parallel, adjustment vector 128 has a magnitude equal to the magnitude of adjustment vector 122 (i.e., 22.5% of road width 38).

Figure 5D:
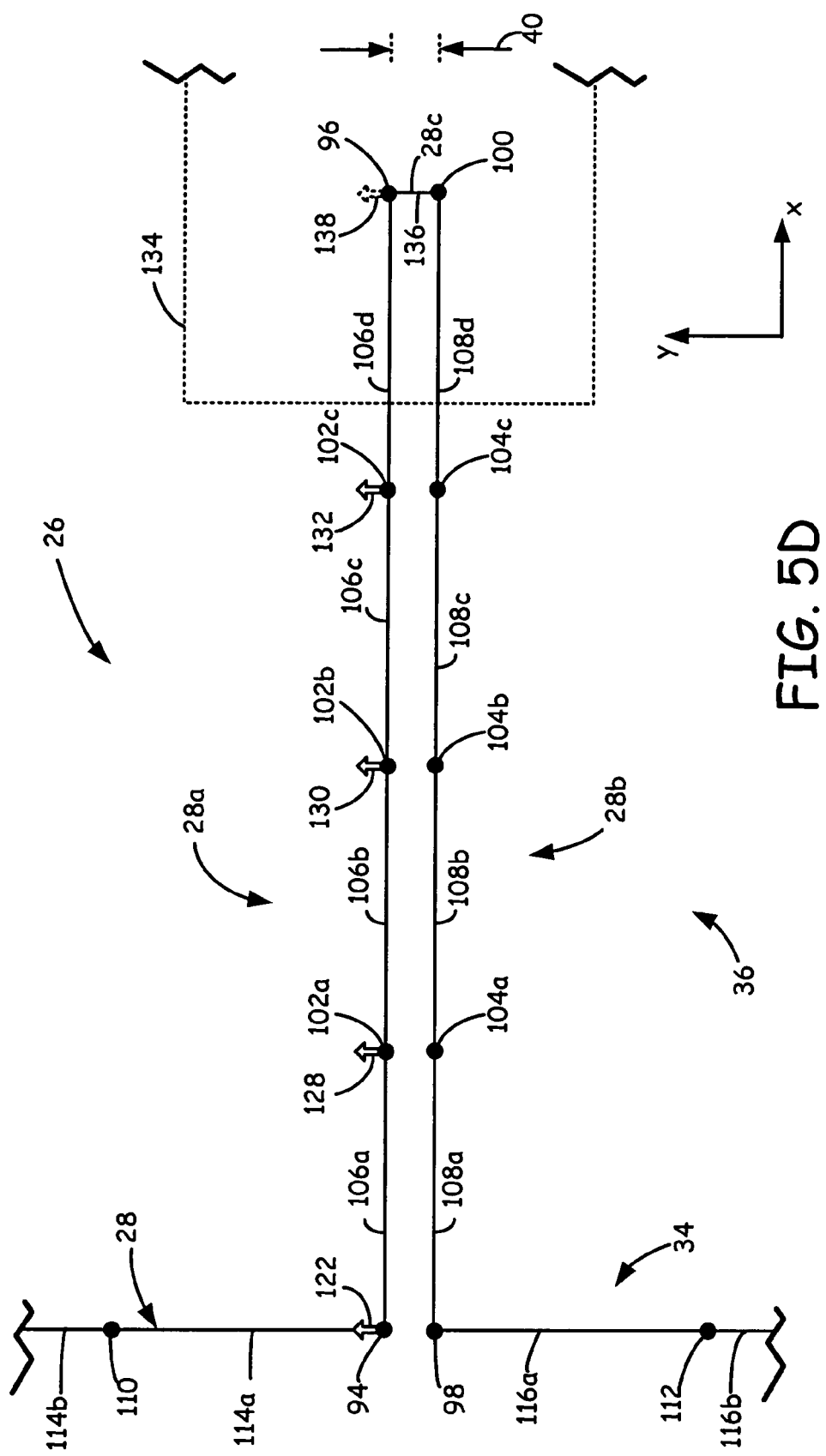

FIG. 5D illustrates thin-wall region 36 after adjustment vectors 130 and 132 are respectively generated for secondary vertices 102*b* and 102*c*. Adjustment vectors 130 and 132 are generated by repeating steps 76-90 of method 70 in the same manner as discussed above for adjustment vector 128. Host computer 16 then determines whether secondary vertex 102*c* is the last vertex along polyline 28, pursuant to step 80 of method 70. Because additional vertices exist along polyline 28 that have not yet been analyzed, host computer 16 proceeds to the next test vertex, pursuant to step 82 of method 70. In the current example, the next vertex in the series is primary vertex 96. Accordingly, pursuant to steps 76, 78, and 84 of method 70, host computer 16 generates test box 134 around primary vertex 96, finds primary vertex 100 within test box 134, and identifies segment 28*c* and sub-segment 108*d* as being adjacent to primary vertex 100.

As shown, segment 28*c* is the segment portion of polyline 28 disposed between primary vertices 96 and 100, which provides an exception to step 86 of method 70. In this scenario, when host computer 16 determines the minimum distance between primary vertex 96 and segment 28*c*/sub-segment 108*d*, host computer 16 omits any segments that connect with the current test vertex (i.e., primary vertex 96). Otherwise, the minimum distance determined in step 86 of method 70 is effectively zero. Accordingly, in the current example, the minimum distance is located directly between primary vertices 96 and 100 (represented by line 136, which overlaps segment 28*c*).

Pursuant to step 88 of method 70, host computer 16 then determines that this minimum distance is less than the threshold wall width. As a result, in one embodiment, host computer 16 may generate adjustment vector 138 (shown with broken lines) for primary vertex 96, where adjustment vector 138 extends from primary vertex 96 in a direction that is substantially collinear with line 136 and away from primary vertex 100, and has a magnitude equal to the magnitudes of adjustment vectors 122, 128, 130, and 132. However, as discussed above, host computer 16 desirably ignores any vertices located on the same segment of polyline 28 as the test vertex within a given range (e.g., 210% of the threshold wall width), thereby limiting the selection of vertices to those that are located on adjacent segments. In the current example, primary vertex 100 is located on the same segment of polyline 28 (i.e., segment 28*c*) as primary vertex 96, and is within 210% of the threshold wall width. Thus, in this embodiment, host computer 16 does not generate adjustment vector 138 for primary vertex 96.

Figure 5E:
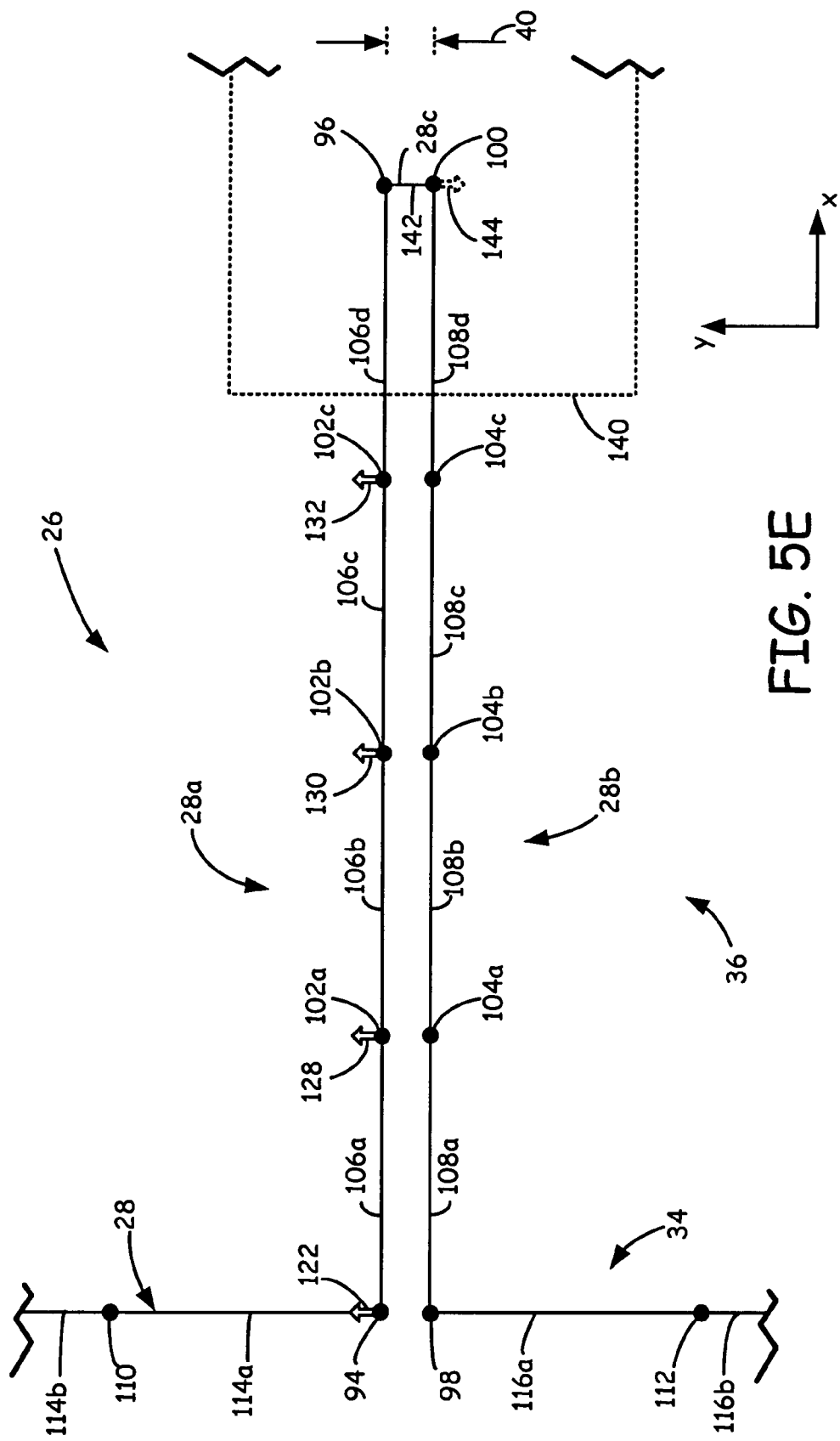

FIG. 5E illustrates thin-wall region 36 after primary vertex 96 is analyzed. Host computer 16 then determines whether primary vertex 96 is the last vertex along polyline 28, pursuant to step 80 of method 70. Because additional vertices exist along polyline 28 that have not yet been analyzed, host computer 16 proceeds to primary vertex 100, pursuant to step 82 of method 70. Pursuant to steps 76, 78, and 84 of method 70, host computer 16 then generates test box 140 around primary vertex 100, finds primary vertex 96 within test box 140, and identifies segment 28*c* and sub-segment 102*d* as being adjacent to primary vertex 96.

As discussed above, host computer 16 desirably omits any segments that connect with the current test vertex (i.e., primary vertex 100). Accordingly, in the current example, segment 28*c* is omitted and the minimum distance is located directly between primary vertices 96 and 100 (represented by line 142, which overlaps segment 28*c*). Pursuant to step 88 of method 70, host computer 16 then determines that this minimum distance is less than the threshold wall width. As a result, in one embodiment, host computer 16 may generate adjustment vector 144 (shown with hidden lines) for primary vertex 100, where adjustment vector 144 extends from primary vertex 100 in a direction that is substantially collinear with line 142 away from primary vertex 96, and has a magnitude equal to the magnitude of adjustment vector 138 (shown in FIG. 5D). However, as discussed above for adjustment vector 138, primary vertex 96 is located on the same segment of polyline 28 (i.e., segment 28*c*) as primary vertex 100, and is within 210% of the threshold wall width. Thus, in this embodiment, host computer 16 does not generate adjustment vector 144 for primary vertex 100.

Figure 5F:
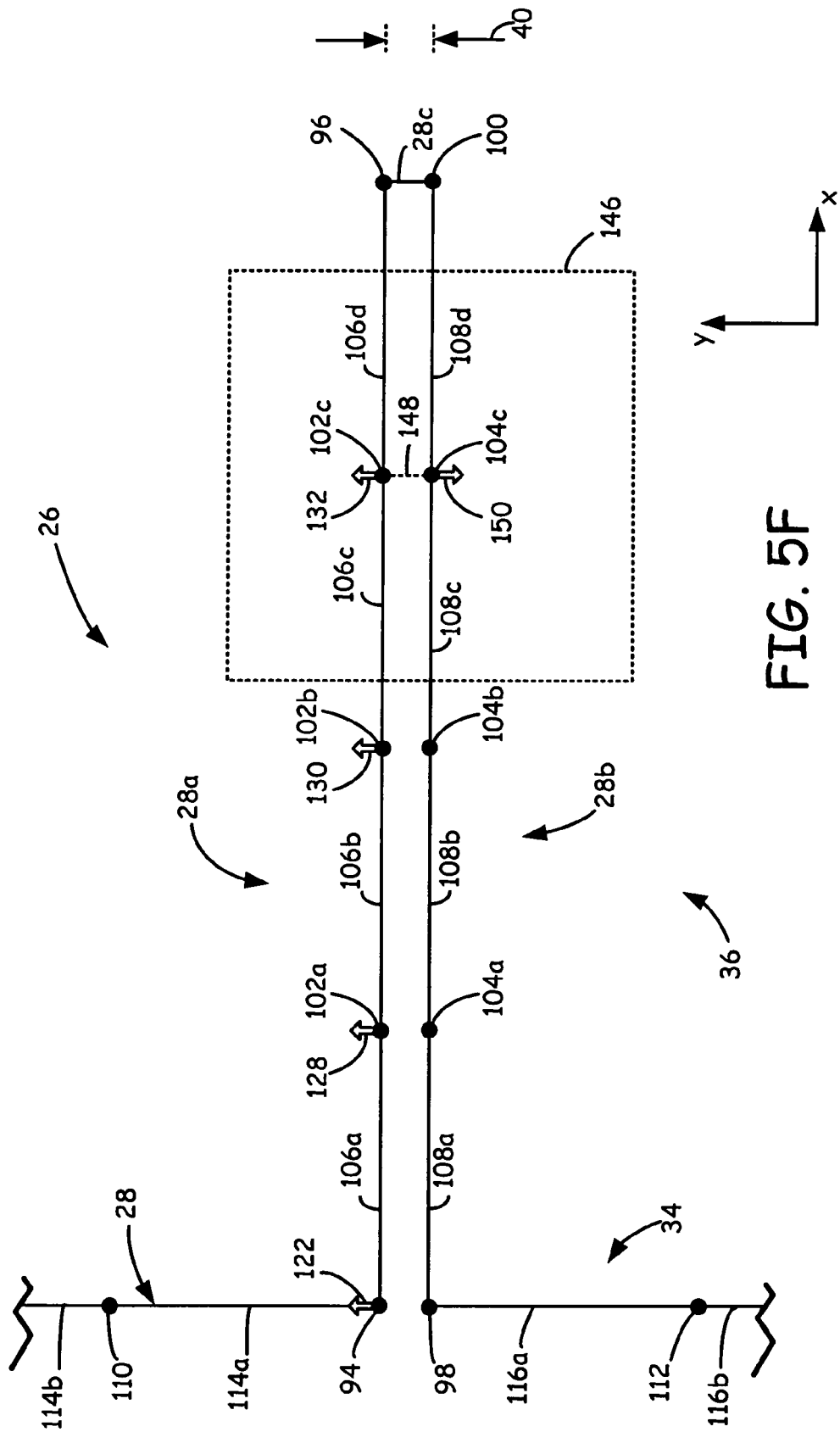

FIG. 5F illustrates thin-wall region 36 after primary vertex 100 is analyzed. Host computer 16 then determines whether primary vertex 100 is the last vertex along polyline 28, pursuant to step 80 of method 70. Because additional vertices exist along polyline 28 that have not yet been analyzed, host computer 16 proceeds to secondary vertex 104*c*, pursuant to step 82 of method 70. Pursuant to steps 76, 78, and 84 of method 70, host computer 16 then generates test box 146 around secondary vertex 104*c*, finds secondary vertex 102*c* within test box 146, and identifies sub-segments 106*c* and 106*d* as being adjacent to secondary vertex 102*c*.

Host computer 16 then determines the minimum distance between secondary vertex 104*c* and sub-segments 106*c* and 106*d*, pursuant to step 86 of method 70. In the current example, the minimum distance is located directly between secondary vertex 102*c* and secondary vertex 104*c* (represented by line 148). Pursuant to step 88 of method 70, host computer 16 then determines whether the minimum distance is less than the threshold wall width. In the current example, the distance between secondary vertex 102*c* and secondary vertex 104*c* is also equal to wall width 40, which is less than the threshold wall width. As a result, host computer 16 generates adjustment vector 150 for secondary vertex 104*c*, where adjustment vector 150 extends from secondary vertex 104c in a direction that is substantially collinear with line 148 and away from secondary vertex 102c, and has a magnitude equal to the magnitude of adjustment vector 144 (shown in FIG. 5E). As discussed above, the adjustment vectors have magnitudes such that the adjusted distance between the vertices is about equal to the threshold wall width, or greater. Accordingly, the combined magnitudes of adjustment vectors 132 and 150 provide an adjusted distance between secondary vertices 102c and 104c that is about equal to the threshold wall width.

FIG. 5G illustrates thin-wall region 36 after adjustment vectors 152 and 154 are respectively generated for secondary vertices 104b and 104a. Adjustment vectors 152 and 154 are generated by repeating steps 76-90 of method 70 in the same manner as discussed above for secondary vertex 104c. Host computer 16 then determines whether secondary vertex 104a is the last vertex along polyline 28, pursuant to step 80 of method 70. Because additional vertices exist along polyline 28 that have not yet been analyzed, host computer 16 proceeds to primary vertex 98, pursuant to step 82 of method 70. Accordingly, pursuant to steps 76, 78, and 84 of method 70, host computer 16 generates test box 156 around primary vertex 98, finds primary vertex 94 within test box 156, and identifies sub-segments 106a and 114a as being adjacent to primary vertex 94.

Host computer 16 then determines the minimum distance between primary vertex 98 and sub-segments 106a and 114a, pursuant to step 86 of method 70. In the current example, the minimum distance is located directly between primary vertices 94 and 98 (represented by line 158). Pursuant to step 88 of method 70, host computer 16 then determines whether the minimum distance is less than the threshold wall width. In the current example, the distance between primary vertices 94 and 98 is also equal to wall width 40, which is less than the threshold wall width. As a result, host computer 16 generates adjustment vector 160 for primary vertex 98, where adjustment vector 160 extends from primary vertex 98 in a direction that is substantially collinear with line 158 and away from primary vertex 94, and has a magnitude equal to the magnitudes of adjustment vectors 150, 152, and 154. The combined magnitudes of adjustment vectors 122 and 160 also provide an adjusted distance between primary vertices 94 and 98 that is at about equal to the threshold wall width.

Figure 5H:
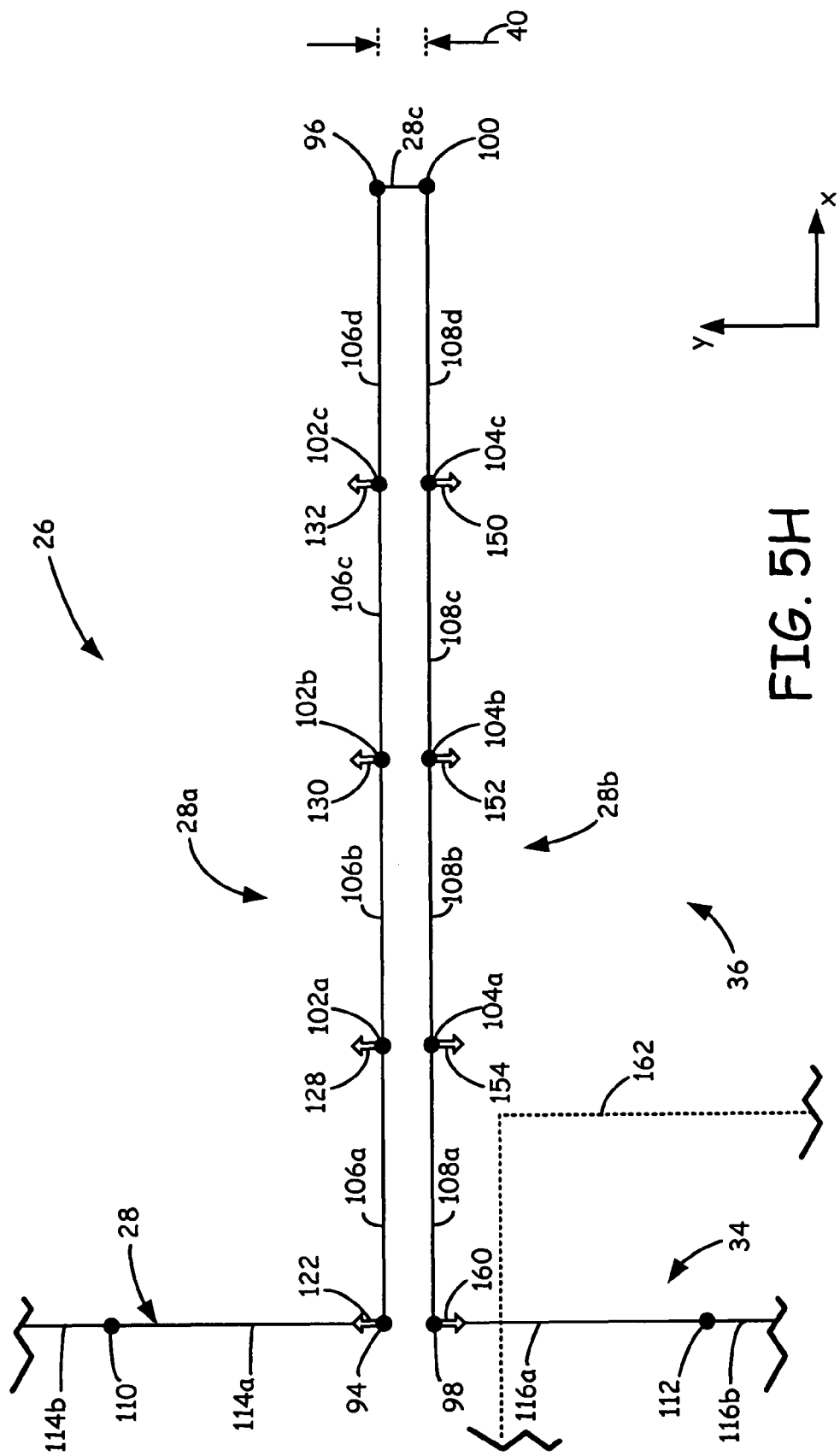

FIG. 5H illustrates thin-wall region 36 after adjustment vector 160 is generated for primary vertex 98. Host computer 16 then determines whether primary vertex 98 is the last vertex along polyline 28, pursuant to step 80 of method 70. Because additional vertices exist along polyline 28 that have not yet been analyzed, host computer 16 proceeds to secondary vertex 112 along polyline 28 at bulk region 34, pursuant to step 82 of method 70. Accordingly, pursuant to step 76 of method 70, host computer 16 generates test box 162 around secondary vertex 112, and searches for any additional vertices within test box 162. At this point, pursuant to step 78 of method 70, host computer 16 does not find any adjacent vertex located within test box 162. As a result, host computer 16 skips steps 84-90 of method 70, and does not generate an adjustment vector for secondary vertex 112. An adjustment vector is not required for secondary vertex 112 because polyline 28 is not at risk of having an overfill condition at secondary vertex 112.

Figure 5I:
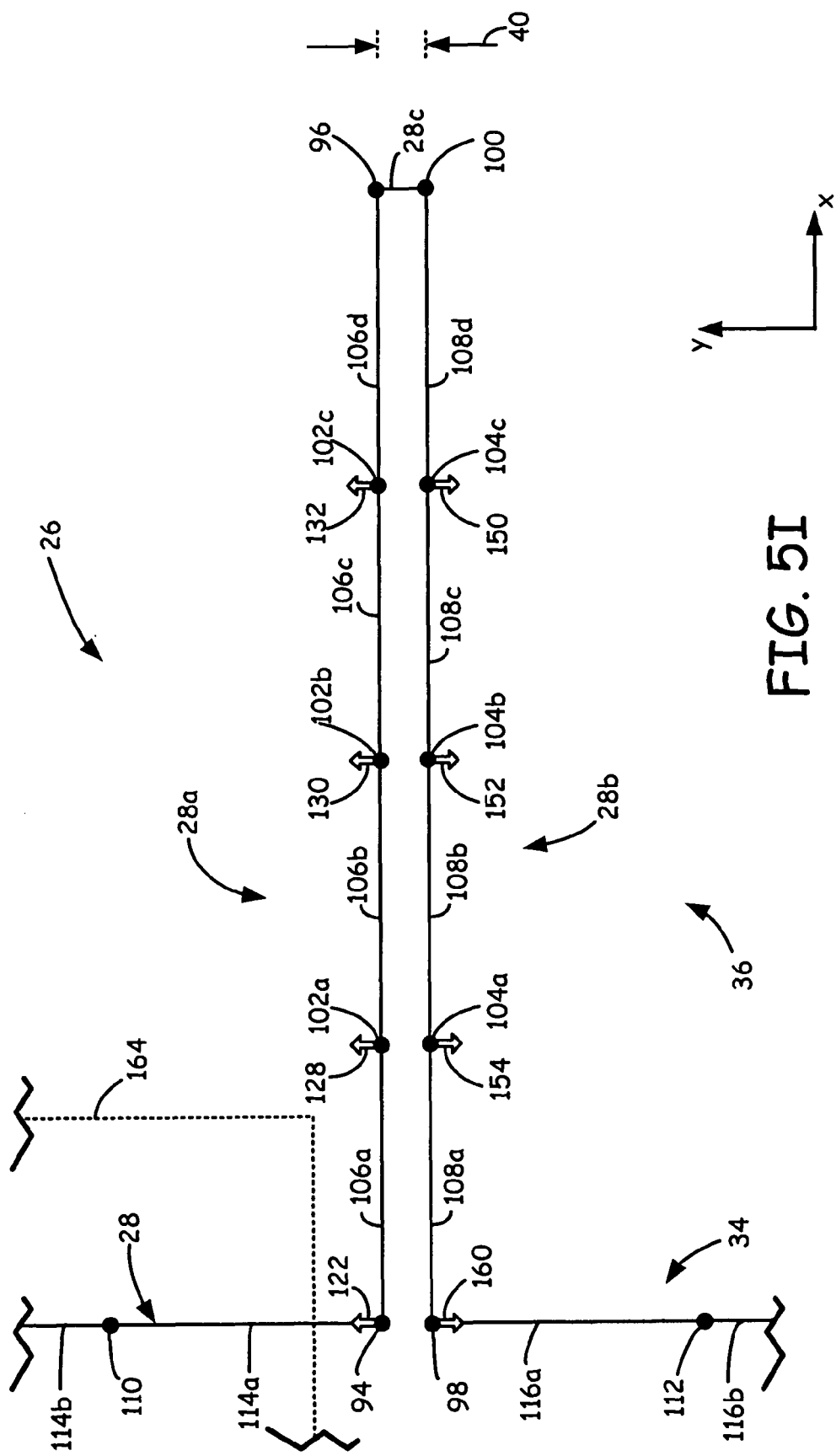

FIG. 5I illustrates thin-wall region 36 after secondary vertex 112 is analyzed. Steps 76-90 are then repeated for the remaining primary and secondary vertices located along polyline 28. As shown in FIG. 5I, the last vertex to be analyzed is secondary vertex 110 along polyline 28 at bulk region 34. When secondary vertex 110 is reached, host computer 16 generates test box 164 around secondary vertex 110, and searches for any additional vertices within test box 164, pursuant to pursuant to step 76 of method 70. At this point, pursuant to step 78 of method 70, host computer 16 does not find any adjacent vertex located within test box 164. As a result, host computer 16 skips steps 84-90 of method 70, and does not generate an adjustment vector for secondary vertex 110.

Figure 5J:
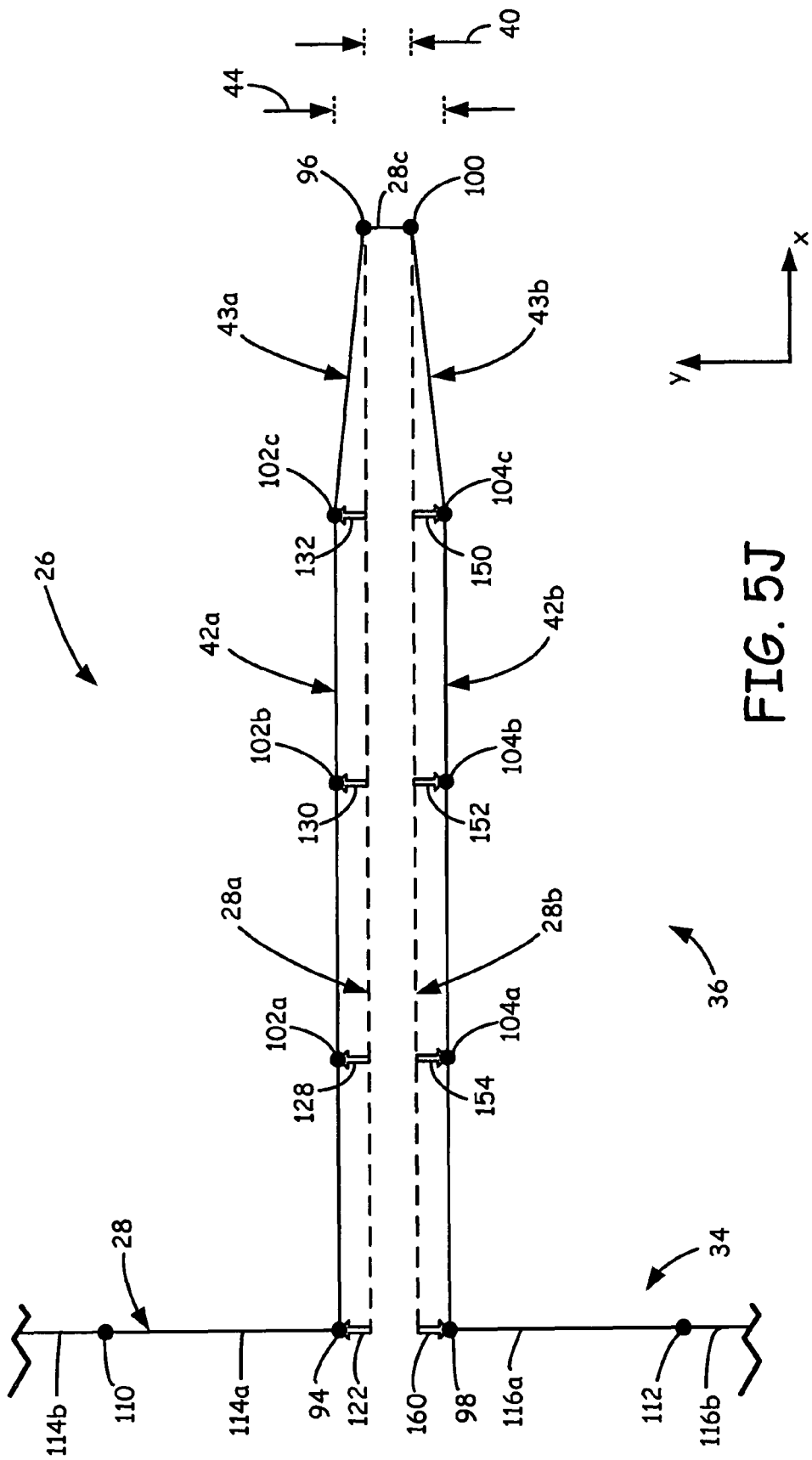

FIG. 5J illustrates thin-wall region 36 after secondary vertex 110 is analyzed. Host computer 16 then determines whether secondary vertex 110 is the last vertex along polyline 28, pursuant to step 80 of method 70. Because all of the vertices along polyline 28 have been analyzed at this point, host computer 16 then adjusts the locations of the vertices based on the adjustment vectors, pursuant to step 92 of method 70. This adjusts segment 28a to the locations of adjusted segments 42a and 43a, and segment 28b to the locations of adjusted segments 42b and 43b, where the adjusted wall width 28 between adjusted segments 42a and 42b is equal to the threshold wall width. As shown, this modifies the geometry of polyline 28 to reduce the risk of overfilling the tool paths at thin-wall region 36 during a build operation with layered deposition system 12 (shown in FIG. 1). Additionally, adjusted segments 43a and 43b converge toward primary vertices 96 and 100, thereby protecting the original geometry of polyline 28 at thin-wall region 36.

Once the geometry of polyline 28 is modified pursuant to method 70, the vertices disposed on collinear sub-segments are removed, pursuant to step 93 of method 70. As such, because the sub-segments of segment 42a are collinear between primary vertex 94 and secondary vertex 102c, secondary vertices 102a and 102b are removed. Similarly, secondary vertices 104a and 104b are removed from the sub-segments of segment 42b, and secondary vertices 110 and 112 are removed. As discussed above, this reduces the number of data coordinates that host computer 16 is required to retain.

FIG. 5K illustrates thin-wall region 36 after secondary vertices 102a, 102b, 104a, 104b, 110, and 112 are removed. Host computer 16 then generates perimeter tool path 166 based on the modified geometry of polyline 26, pursuant to step 62 of method 46 (shown in FIG. 3). Because segments 42a and 42b are separated by adjusted wall width 44, which is about equal to threshold wall width, the wrap-around portions of perimeter tool path 166 have acceptable amounts of overlap, thereby reducing the risk of overfilling the corresponding region of 3D object 24.

As shown in FIGS. 5A-5K, each vertex that was adjusted only had a single adjacent vertex located within the corresponding test box. As such, the adjustment vector was generated only in response to the single adjacent vertex. However, in situations where multiple adjacent vertices exist with a given test box, steps 86, 88, and 90 of method 70 are performed for each adjacent vertex, and the generated adjustment vectors are cumulative. This ensures that the test vertex is repositioned relative to each of the multiple adjacent vertices. Additionally, while method 70 is discussed above in use with a single thin-wall region (i.e., thin-wall region 36), method 70 is also suitable for use with a polyline having multiple thin-wall regions having various geometric designs.

Figure 6A:
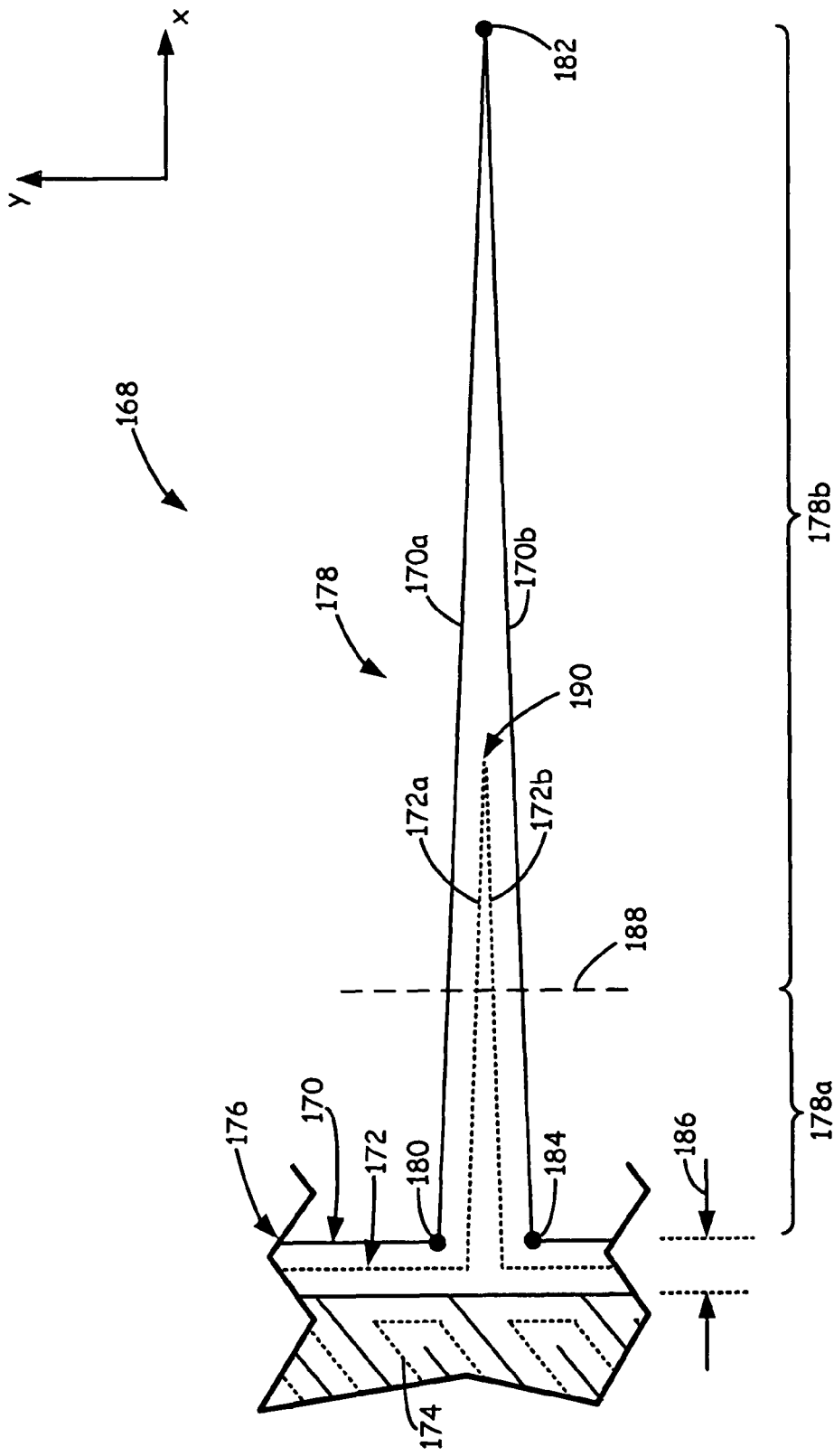
FIGS. 6A-6C are schematic views of an alternative thin-wall region of a sliced layer, which forms a converging spike, further illustrating the method shown in FIG. 4.
Figure 6B:
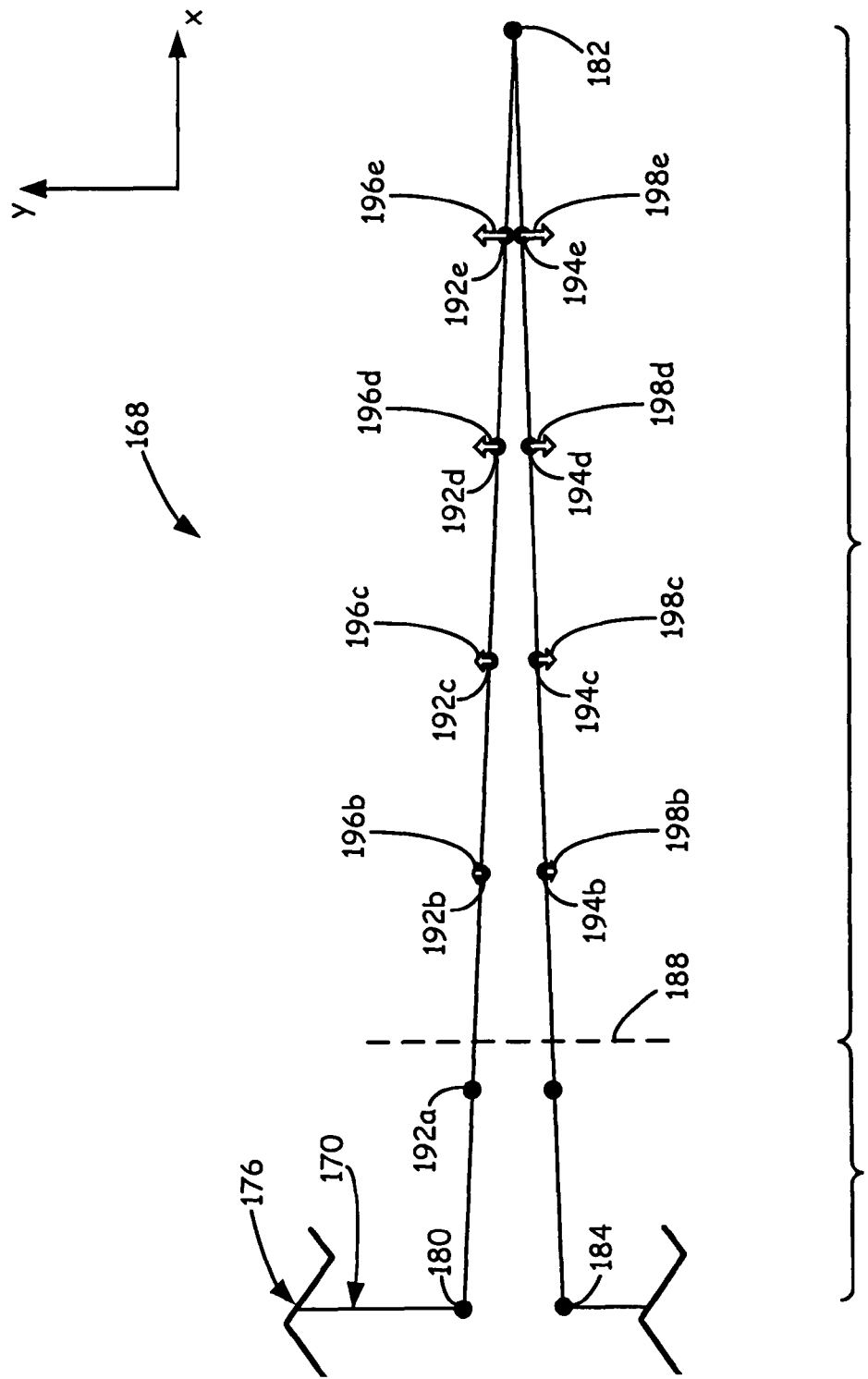
Figure 6C:
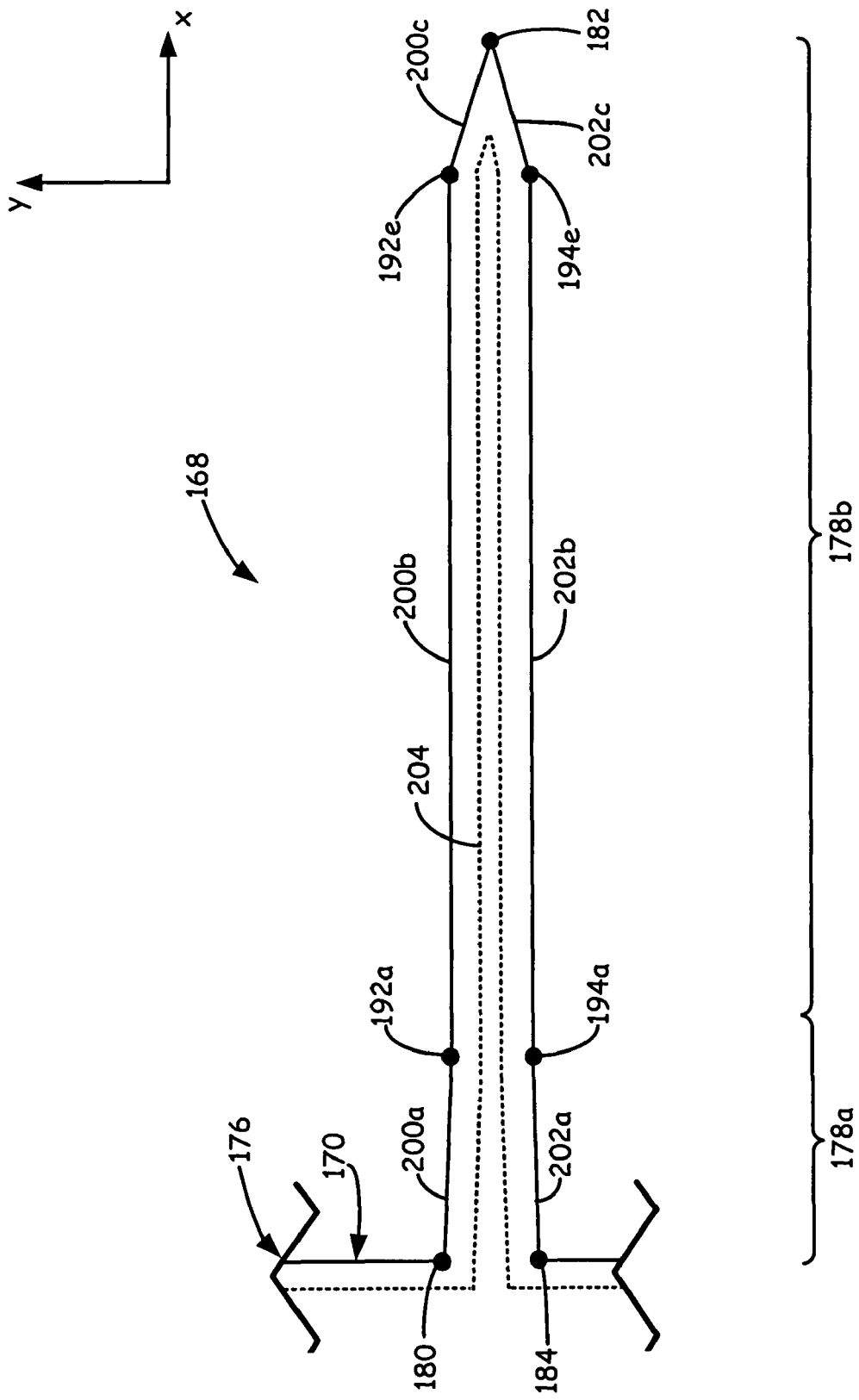

FIGS. 6A-6C are schematic views of layer 168, which is a sliced layer of an alternative CAD model. As shown in FIG. 6A, layer 168 is similar to layer 26 (shown in FIG. 2) and includes polyline 170, perimeter tool path 172, and raster tool path 174. Polyline 170 is a perimeter geometry disposed in an x-y plane, which has a converging spike geometry rather than the parallel-segment geometry of polyline 28 (shown in FIG.

2). The region within polyline 170 is the portion of layer 168 that will be filled with build material during a build operation, and is divided into bulk region 176 and thin-wall region 178. As shown at thin-wall region 178, polyline 170 is defined by primary vertices 180, 182, and 184, where primary vertices 180 and 184 are located at the intersection between bulk region 176 and thin-wall region 178, and primary vertex 182 is located at the tip of the converging spike.

Primary vertices 180, 182, and 184 divide polyline 170 into segments 170a and 170b, where segment 170a interconnects primary vertices 180 and 182, and segment 170b interconnects primary vertices 182 and 184. The converging nature of segments 170a and 170b correspondingly divides thin-wall region 178 into first region 178a and second region 178b at threshold line 188. Threshold line 188 is the location along segments 170a and 170b where the wall width of thin-wall region 178 along the y-axis is equal to the threshold wall width for layered deposition system 12 (shown in FIG. 1). As such, the widths of first region 178a are greater than the threshold wall width, and the widths of second region 178b are less than the threshold wall width.

Perimeter tool path 172 and raster tool path 174 are generated based on road width 186, which is the predicted width of a deposited road of build material from layered deposition system 12, as discussed above for road width 38 (shown in FIG. 2). Perimeter tool path 172 is generated at an interior offset location relative to polyline 170, which is at a distance of about one-half of road width 186. Raster tool path 174 is then generated at an interior offset location relative to perimeter tool path 172, thereby filling bulk region 176.

When perimeter tool path 172 is generated with the wrap-around arrangement at thin-wall region 178, the adjacent tool paths (referred to as sub-paths 172a and 172b) have increasing amounts of overlap as they proceed toward primary vertex 182. When sub-paths 172a and 172b transition across threshold line 188 from first region 178a to second region 178b, the overlapping of sub-paths 172a and 172b becomes great enough to cause the deposited roads of build material to overfill the corresponding region of the 3D object. As discussed above, this may result in poor part quality and potentially damaging layered deposition system 12.

Furthermore, as shown in FIG. 6A, sub-paths 172a and 172b converge at a point (referred to as point 190) that is substantially short of primary vertex 182 along the x-axis. As such, the roads of deposited build material based on sub-paths 172a and 172b will not extend along the x-axis to the corresponding location of primary vertex 182. This also reduces part quality when building 3D objects. As such, to improve part quality and reduce the risk of creating an overfill condition at second region 178b, host computer 16 (shown in FIG. 1) modifies the geometry of thin-wall region 178 pursuant to method 70 (shown in FIG. 4).

FIG. 6B shows layer 168 after host computer 16 has analyzed each vertex along polyline 170, pursuant to steps 72-90 of method 70 (shown in FIG. 4). As shown, segment 170a also includes secondary vertices 192a-192e, and segment 170b also includes secondary vertices 192a-194e, which are generated pursuant to step 72 of method 70. Pursuant to method 70, host computer 16 analyzes each primary and secondary vertex and generates adjustment vectors for the vertices at portions that have separation distances less than the threshold wall width.

Because first region 178a has wall widths greater than the threshold wall width, primary vertices 180 and 184, and secondary vertices 192a and 194a will not have adjustment vectors generated. However, because second region 178b has wall widths less than the threshold wall width, secondary vertices 192b-192e and 194b-194e have adjustment vectors 196b-196e and 198b-198e respectively generated for them. As shown, the magnitudes of adjustment vectors 196b-196e and 198b-198e increase with the decreasing wall width of second region 178b. This is due to the reduction in the "minimum distance" (used in Equation 1) with the decreasing wall width.

It is noted that primary vertex 182 does not have an adjustment vector generated. As discussed above for step 72 of method 70, secondary vertices are desirably not generated within a certain distance from the primary vertices to protect the original geometry of the polyline (e.g., polyline 170). This embodiment is beneficial for use with thin-wall regions having converging spike geometries, such as thin-wall region 178. In the current example, restricting the location of secondary vertices 192e and 194e prevents the location of primary vertex 182 from being adjusted, thereby retaining the original length of thin-wall region 178 along the x-axis.

After each vertex is analyzed, host computer 16 adjusts the locations of the secondary vertices 192b-192e and 194b-194e based on adjustment vectors 196b-196e and 198b-198e, pursuant to step 92 of method 70. This positions secondary vertices 192b-192e and 194b-194e to opposing locations that provide a wall width along second region 178b that is about equal to the threshold wall width, or greater. Host computer 16 then removes any vertices that are located on collinear sub-segments, pursuant to step 93 of method 70. In the current example, this removes secondary vertices 192b-192d and 194b-194d.

FIG. 6C shows layer 168 after the geometry of polyline 170 is modified pursuant to method 70. After the geometry of polyline 170 is modified, segment 170a (shown in FIG. 6A) is subdivided into sub-segment 200a (between primary vertex 180 and secondary vertex 192a), sub-segment 200b (between secondary vertices 192a and 192e), and sub-segment 200c (between secondary vertex 192e and primary vertex 182). Similarly, segment 170b (shown in FIG. 6A) is subdivided into sub-segment 202a (between primary vertex 184 and secondary vertex 194a), sub-segment 202b (between secondary vertices 194a and 194e), and sub-segment 202c (between secondary vertex 194e and primary vertex 182).

Because the wall thicknesses at first portion 178a are greater than the threshold wall width, segments 200a and 202a are unchanged. However, segments 200b and 202b are now located at positions that provide a wall width that is about equal to the threshold wall width, or greater. Segments 200c and 202c provide a small converging portion for polyline 170, thereby allowing roads of deposited build material to substantially reach the location of primary vertex 182 along the x-axis. Once the geometry of polyline 170 is modified pursuant to method 70, perimeter tool path 204 is generated based on the modified geometry. Because second region 178b has a wall width that is equal to the threshold wall width, or greater, the wrap-around sub-paths of perimeter tool path 204 have acceptable amounts of overlap, thereby reducing the risk of overfilling the corresponding region of the 3D object.

Figure 7:
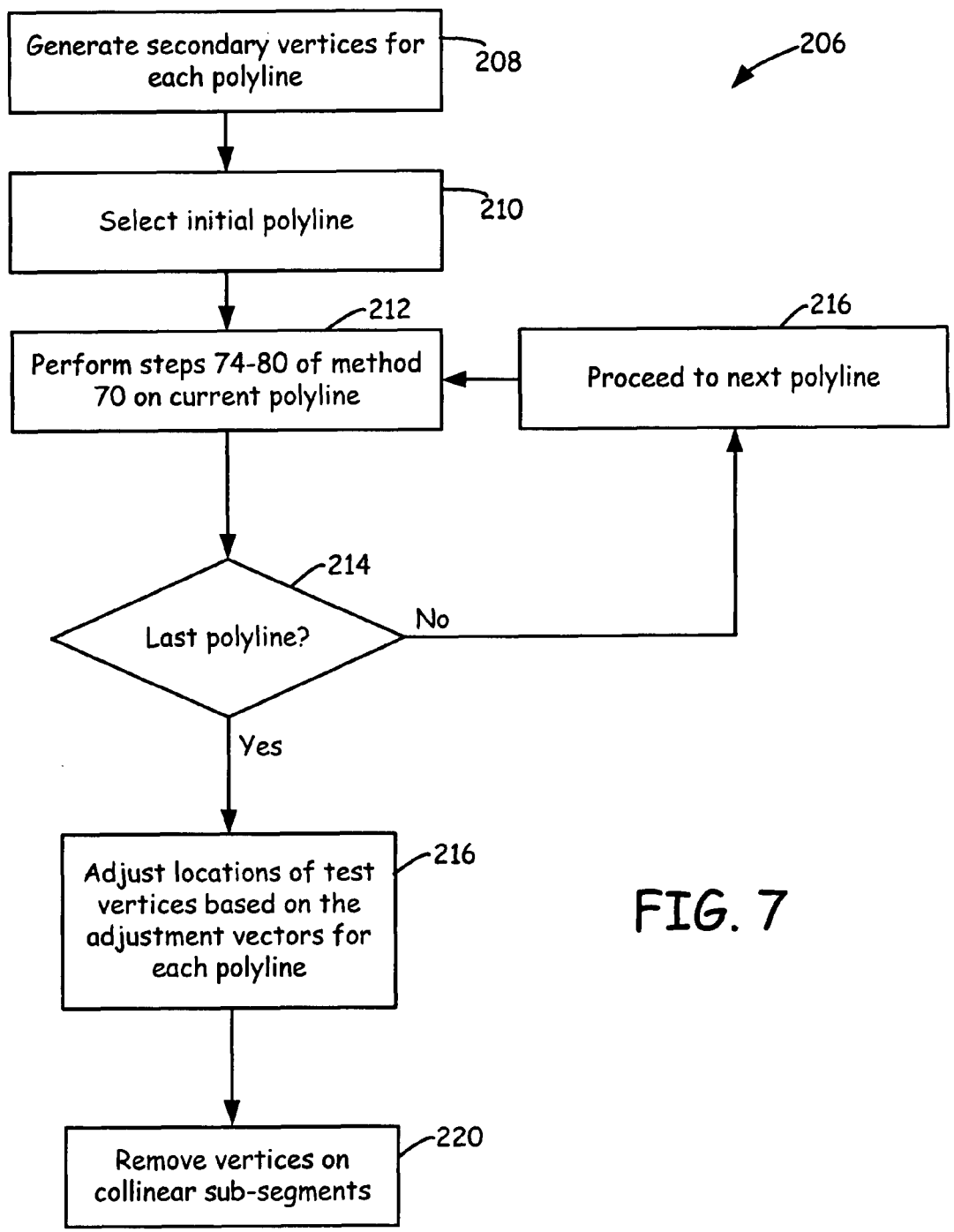
FIG. 7 is a flow diagram of a method for modifying the geometry of a thin-wall region disposed between two or more polylines.

FIG. 7 is a flow diagram of method 206, which is similar to method 70 (shown in FIG. 4), but is suitable for use with sliced layers having multiple polylines. Many CAD model designs may include multiple polylines for a given sliced layer. For example, a sliced layer may include a first polyline that defines an outer surface of a 3D object and a second polyline defining an inner surface (e.g., inner cavity) of the 3D object. While method 70 is suitable for identifying one or more thin-wall regions within a single polyline, method 206 expands on method 70 to further identify thin-wall regions that may exist between two or more polylines. Method 206 includes steps 208-220, and initially involves generating secondary vertices for each polyline (step 208). For each polyline, the secondary vertices are generated in the same manner as discussed above in step 72 of method 70. This allows host computer 16 to identify vertices lying outside of a particular polyline.

Host computer 16 then identifies a first polyline of the multiple polylines (step 210), and performs steps 74-80 of method 70 for the identified polyline (step 212). This generates adjustment vectors for each vertex along the identified polyline in the same manner as discussed above for method 70. However, because each of the multiple polylines includes a series of primary and secondary vertices, host computer 16 may also rely on vertices external to the current polyline when identifying adjacent vertices, pursuant to step 76 of method 70. As a result, the adjustment vectors may also be generated based on potential overfill conditions between adjacent polylines.

When each vertex of the current polyline is analyzed, host computer 16 then determines whether the current polyline is the last polyline for the given layer (step 214). If not, then host computer 16 proceeds to the next polyline of the layer (step 216), and repeats step 212 for each remaining polyline. When each vertex of the last polyline is analyzed, host computer 16 then adjusts the locations of the vertices based on the adjustment vectors for each polyline of the sliced layer (step 218), and vertices located on collinear sub-segments are removed (step 220). Steps 218 and 220 are desirably performed after adjustment vectors are generated for the required vertices of all of the polylines of the given sliced layer. Otherwise, if the locations of the vertices of a first polyline were adjusted pursuant step 218 before a second polyline is analyzed, the adjusted locations of the first polyline vertices may prevent the desired identification of adjacent vertices when the second polyline is analyzed. Accordingly, method 206 is suitable modifying the geometries of multiple polylines within a given sliced layer. It is noted that method 206 is also suitable for use with a sliced layer containing a single polyline. In this situation, steps 208, 210, 214, and 216 of method 206 become redundant, thereby reducing method 206 to the same steps as method 70.

Figure 8:
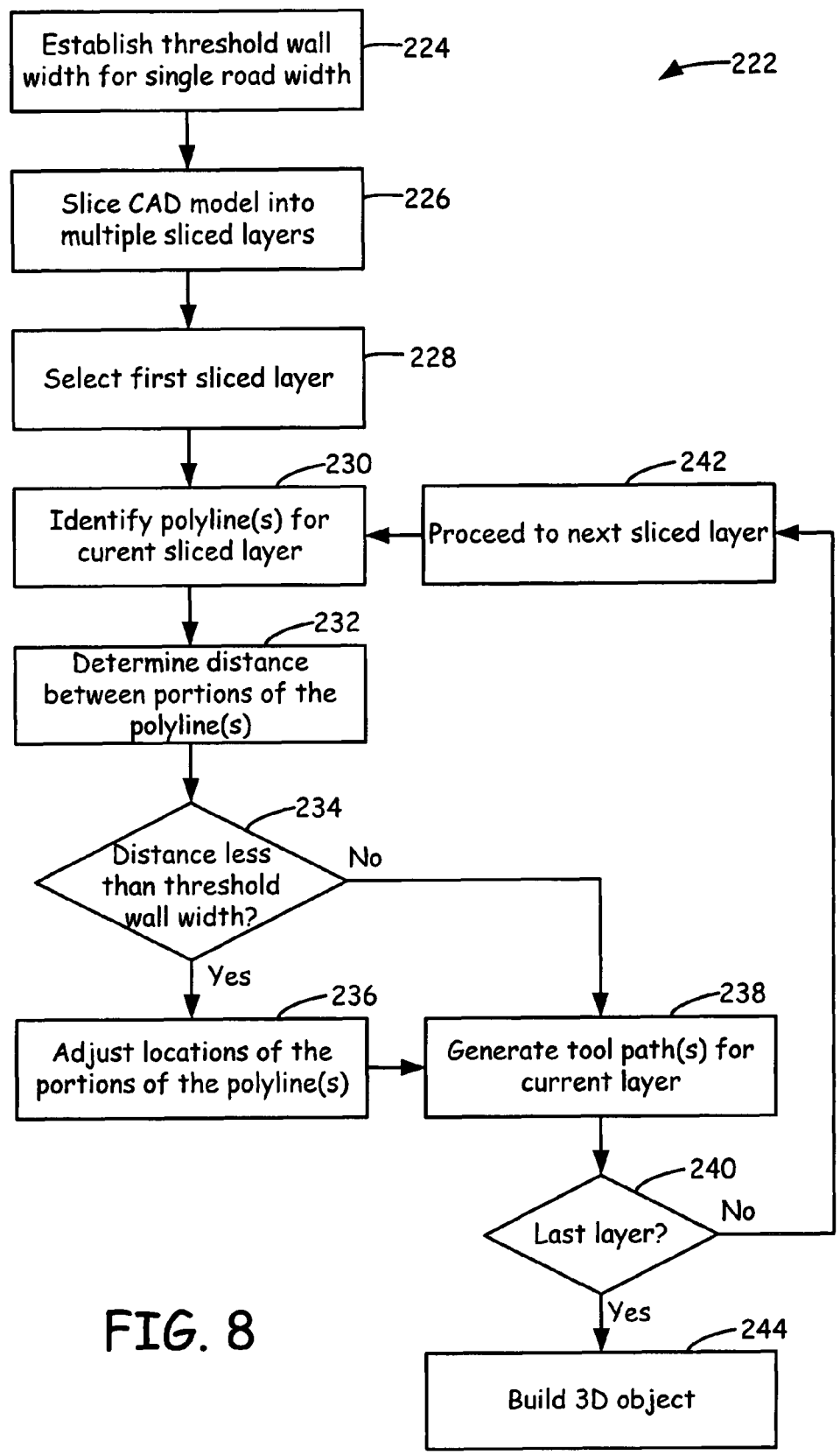
FIG. 8 is a flow diagram of a method for building a 3D object from a CAD model containing a thin-wall region that is narrower than a single road width.

FIG. 8 is a flow diagram of method 222 for building a 3D object from a CAD model having a thin-wall region less than a single road width, which illustrates an alternative embodiment to method 46 (shown in FIG. 3). In addition to creating potential overfill conditions, a CAD model may also describe a 3D object having a thin-wall region that is narrower than a single road width (e.g., road width 38, shown in FIG. 2). This typically occurs when the geometry of the 3D object is misspecified in the CAD model. Unfortunately, in this situation, host computer 16 may not necessarily generate a build path for the thin-wall region. Moreover, algorithms that generate support structures for the 3D object will typically identify the thin-wall region, thereby precluding the generation of a support structure component for the thin-wall region. As a result, roads of material are not deposited for the thin-wall region, which may affect subsequently deposited layers that rely on the thin-wall region for support.

Method 222 is suitable for modifying the geometries of thin-wall regions that are narrower than a single road width. Method 222 includes steps 224-244, and initially involves establishing a "threshold wall width" for a layered deposition system (e.g., layered deposition system 12, shown in FIG. 1), where the threshold wall width is about equal to the road width of the deposited build material (e.g., road width 38, shown in FIG. 2) (step 224). As discussed above, the "threshold wall width" used in method 46 is referred to as the minimum wall width at which a pair of adjacent roads of build material can be deposited without substantially overfilling. Method 222, however, relies on a threshold wall width for identifying regions that are narrower than the road width. As such, in this embodiment, the "threshold wall width" is about equal to the road width.

Once the threshold wall width is established, steps 226-244 of method 222 are then performed in the same manner as discussed above for steps 50-68 of method 46. Accordingly, the CAD model is sliced into multiple sliced layers, where each sliced layer includes one or more polylines (step 226). Host computer 16 then selects a first sliced layer to analyze (step 228), and identifies the coordinates of the polyline(s) of the selected sliced layer (step 230). The identified polyline(s) is then analyzed to determine the distance between adjacent portions of the polyline(s) (step 232). In alternative embodiments, the determination of the threshold wall width in step 224 may be performed after one or more of steps 226-232 for the first selected sliced layer.

Host computer 16 then determines whether the distance between the adjacent portions is less than the threshold wall width (i.e., less than a single road width) (step 234). If so, host computer 16 then adjusts the locations of the adjacent portions of the polyline(s) such that an adjusted wall width between the portions is about equal to the threshold wall width (i.e., about equal to the road width) (step 236). Host computer 16 then generates one or more tool paths for the current sliced layer based on the polyline(s) with the adjusted portions (step 238). Because the adjusted wall width between the portions is about equal to the road width, a single tool path is generated for the thin-wall region.

Host computer 16 then determines whether the current sliced layer is the last sliced layer of the CAD model to be analyzed for thin-wall geometries (step 240). If not, host computer 16 proceeds to the next sliced layer of the CAD model (step 242), and repeats steps 230-238 for each remaining sliced layer. This modifies the geometries of thin-wall regions in each sliced layer of the CAD model such that each thin-wall region has a width that is at least about equal to the road width of deposited build material. When the last sliced layer is analyzed (step 240), host computer 16 then relays the corresponding build data to controller 14 (shown in FIG. 1) to build the 3D object with layered deposition system 12 (step 244).

Because the adjusted portions of the polyline(s) for each sliced layer are separated by a distance about equal to the road width, host computer 16 is capable of generating a tool path for the thin-wall region. This allows the thin-wall region to provide interlayer support for subsequently formed layers. In one embodiment, steps 232-236 of method 222 are performed in the same manner as discussed above for method 70, where the threshold wall width is about equal to the road width. Additionally, method 222 may be also performed with multiple polylines in the same manner as discussed above for method 206.

Figure 9:
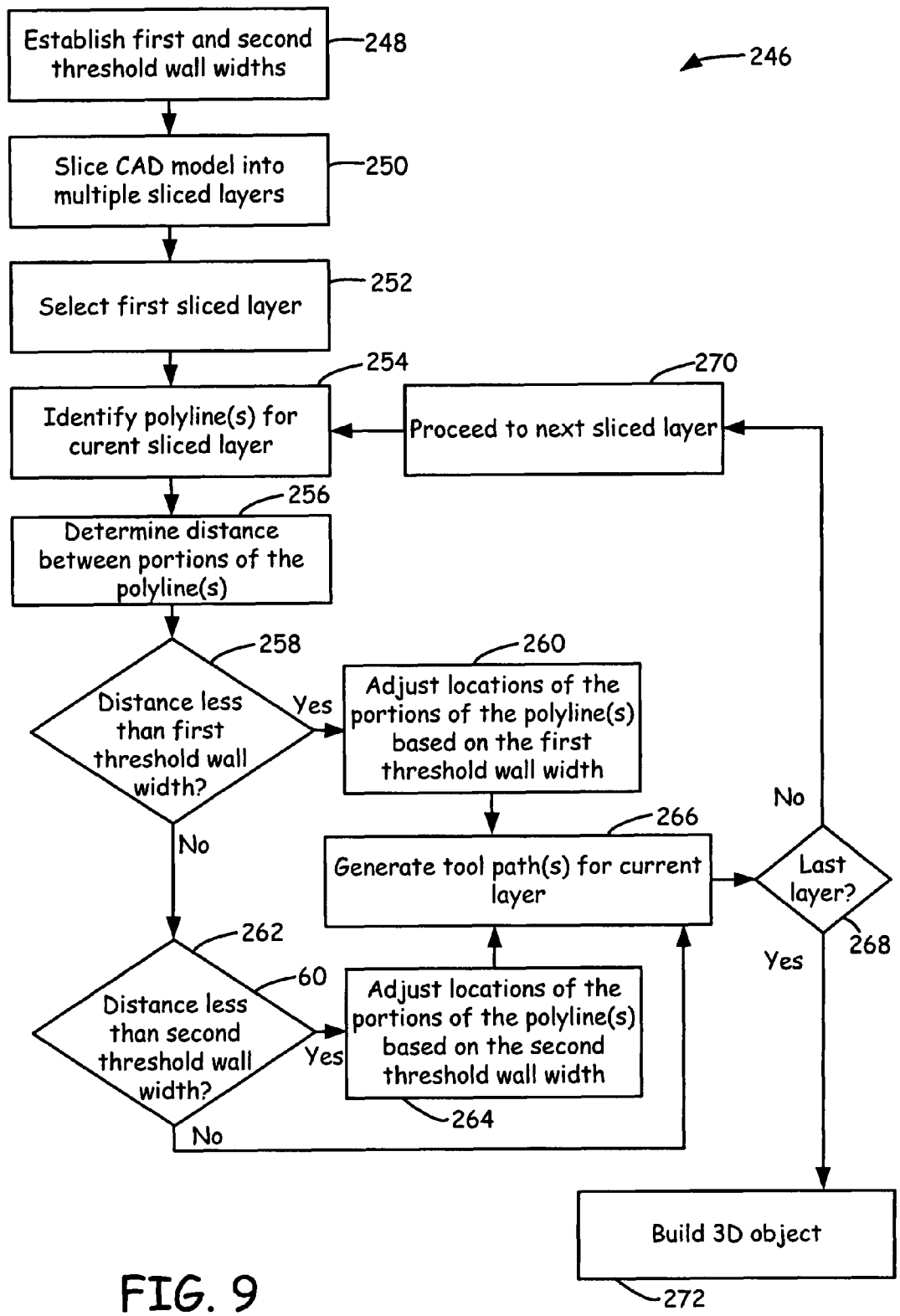
FIG. 9 is a flow diagram of a method for building a 3D object from a CAD model containing a thin-wall region that creates a potential overfill condition and/or a thin-wall region that is narrower than a single road width.

FIG. 9 is a flow diagram of method 246, which is a combination of method 46 (shown in FIG. 3) and method 222 (shown in FIG. 8). As such, method 246 is suitable for reducing the risk of creating overfill conditions and for providing interlayer support for the 3D objects during build operations. Method 246 includes steps 248-272, and initially involves establishing a "first threshold wall width" and a "second threshold wall width" for a layered deposition system (e.g., layered deposition system 12, shown in FIG. 1) (step 248). The first threshold wall width is the same as the threshold wall width discussed above in step 224 of method 222. Accordingly, first threshold wall width is about equal to the road width of the deposited build material. The second threshold wall width is the same as the threshold wall width discussed above in step 48 of method 46. As such, examples of suitable second threshold wall widths include those discussed above for the threshold wall width in step 48 of method 46.

Once the first and second threshold wall widths are established, the CAD model is sliced into multiple sliced layers, where each sliced layer includes one or more polylines (step 250). Host computer 16 then selects a first sliced layer to analyze (step 252), and identifies the coordinates of the polyline(s) of the selected sliced layer (step 254). The identified polyline(s) is then analyzed to determine the distance between adjacent portions of the polyline(s) (step 256). In alternative embodiments, the determination of the first and second threshold wall widths in step 248 may be performed after one or more of steps 250-256 for the first selected sliced layer.

Host computer 16 then determines whether the distance between the adjacent portions is less than the first threshold wall width (i.e., less than a single road width) (step 258). This step allows host computer 16 to determine whether the wall width is too narrow to deposit a single road of build material. If so, host computer 16 then adjusts the locations of the adjacent portions of the polyline(s) such that an adjusted wall width between the portions is about equal to the first threshold wall width (i.e., about equal to the road width) (step 260). Host computer 16 then generates one or more tool paths for the current sliced layer based on the polyline(s) with the adjusted portions (step 266).

If the distance between the adjacent portions is not less than the first threshold wall width (step 258), host computer 16 then determines whether the distance between the adjacent portions is less than the second threshold wall width (step 262). This step allows host computer 16 to determine whether the wall width may create an overfill condition. Because host computer 16 already determined that the distance between the adjacent portions is at least as great as a single road width in step 258, step 262 effectively determines whether the distance between the adjacent portions falls between the first and second threshold wall widths. If the distance between the adjacent portions is less than the second threshold wall width, host computer 16 then adjusts the locations of the adjacent portions of the polyline(s) such that an adjusted wall width between the portions is about equal to the second threshold wall width, or greater (step 264). Host computer 16 then generates one or more tool paths for the current sliced layer based on the polyline(s) with the adjusted portions (step 266).

In one embodiment, host computer 16 performs steps 256-264 for each thin-wall region of the current sliced layer. As such, for the current sliced layer, portions of a first region of the polyline(s) may be adjusted pursuant to step 260 and portions of a second region of the polyline(s) may be adjusted pursuant to step 264. In this embodiment, steps 256, 258, and 260 are desirably performed pursuant to method 70 (shown in FIG. 4), where the "threshold wall width" refers to the first threshold wall width, and steps 256, 262, and 264 are desirably performed pursuant to method 70, where the "threshold wall width" refers to the second threshold wall width. This allows method 246 to modify the geometries of multiple thin-wall regions in a single sliced layer, where the thin-wall regions are either narrower than the road width or may create overfill conditions.

After the tool path(s) are generated, host computer 16 then determines whether the current sliced layer is the last sliced layer of the CAD model to be analyzed for thin-wall geometries (step 268). If not, host computer 16 proceeds to the next sliced layer of the CAD model (step 270), and repeats steps 254-266 for each remaining sliced layer. This modifies the geometries of thin-wall regions in each sliced layer of the CAD model. When the last sliced layer is analyzed (step 268), host computer 16 then relays the corresponding build data to controller 14 (shown in FIG. 1) to build the 3D object with layered deposition system 12 (step 272).

Method 248 illustrates a suitable embodiment for adjusting the locations of adjacent portions of the polyline(s) for a given sliced layer, and functions in a similar manner to methods 46 and 222. For example, if a given CAD model does not include any portions having wall widths less than the first threshold wall width, then steps 258 and 260 become redundant, thereby reducing method 246 to the same steps as method 46. Alternatively, if a given CAD model does not include any portions having wall widths greater than the first threshold wall width and less than the second threshold wall width, then steps 262 and 264 become redundant, thereby reducing method 246 to the same steps as method 222. Additionally, method 246 may be also performed with multiple polylines in the same manner as discussed above for method 206 (shown in FIG. 7).

As discussed above, based on different values for the threshold wall widths, the present invention is suitable for modifying the geometries of thin-wall regions for a variety of purposes (e.g., reducing overfill conditions and providing interlayer support). This increases the quality the 3D objects during build operations. Although the present invention has been described with reference to preferred embodiments, workers skilled in the art will recognize that changes may be made in form and detail without departing from the spirit and scope of the invention.

The invention claimed is:

1. A method for modifying a computer-aided design model of a three-dimensional object implemented by a computer, the method comprising:
   providing a threshold wall width ranging from about 150% of a road width of build material deposited from a layered deposition system to about 200% of the road width;
   providing at least one sliced layer polyline of the computer-aided design model to the computer, the at least one sliced layer polyline comprising a first portion and a second portion;
   determining, by the computer, a first distance between the first portion and the second portion; and
   adjusting, by the computer, locations of the first portion and the second portion to provide a second distance between the first portion and the second portion if the first distance is less than the threshold wall width, wherein the second distance is about equal to the threshold wall width, or greater.

2. The method of claim 1, wherein the layered deposition system comprises an extrusion-based layered deposition system having a controller that is configured to interact with the computer.

3. The method of claim 2, wherein the threshold wall width ranges from about 160% of the road width to about 180% of the road width.

4. The method of claim 1, wherein the road width ranges from about 250 micrometers to about 510 micrometers.

5. The method of claim 1, wherein the first portion comprises a first vertex and the second portion comprises a second vertex, and wherein adjusting, by the computer, the locations of the first portion and the second portion comprises:
   generating a first adjustment vector for the first vertex;
   generating a second adjustment vector for the second vertex;

repositioning the first vertex based on the first adjustment vector; and repositioning the second vertex based on the second adjustment vector.

6. The method of claim 1, wherein the first portion comprises a first vertex interconnecting a first segment and a second segment, wherein the second portion comprises a second vertex interconnecting a third segment and a fourth segment, and wherein determining the first distance comprises:

determining, by the computer, a first minimum distance between the first vertex and the third and fourth segments; and determining, by the computer, a second minimum distance between the second vertex and the first and second segments.

7. The method of claim 1, further comprising generating, by the computer, a perimeter tool path based on the sliced layer polyline having the first portion and the second portion at the adjusted locations.

8. A method for modifying a computer-aided design model of a three-dimensional object implemented by a computer, the method comprising:

providing a threshold wall width;

providing at least one sliced layer polyline of the computer-aided design model to the computer, the at least one sliced layer polyline comprising a plurality of vertices and a plurality of segments;

determining, by the computer, a first distance between a first vertex of the plurality of vertices and at least one segment of the plurality of segments; and adjusting, by the computer, a location of the first vertex if the first distance is less than the threshold wall width.

9. The method of claim 8, wherein the threshold wall width is a function of a road width of build material deposited from a layered deposition system, wherein the road width ranges from about 250 micrometers to about 510 micrometers.

10. The method of claim 8, wherein determining, by the computer, the first distance between the first vertex and the at least one segment comprises:

searching for at least a second vertex of the plurality of vertices within a predetermined distance from the first vertex, wherein the second vertex is connected to the at least one segment; and determining a minimum distance between the first vertex and the at least one segment.

11. The method of claim 8, wherein adjusting, by the computer, the location of the first vertex comprises:

generating an adjustment vector for the first vertex as a function of the threshold wall width; and repositioning the first vertex based on the adjustment vector.

12. The method of claim 8, wherein the threshold wall width is a first threshold wall width, the method further comprising:

establishing, by the computer, a second threshold wall width; and adjusting, by the computer, the location of the first vertex if the first distance is less than the second threshold wall width.

13. The method of claim 8, further comprising generating, by the computer, a perimeter tool path based on the sliced layer polyline having the first vertex at the adjusted location.

14. A method for modifying a computer-aided design model of a three-dimensional object implemented by a computer, the method comprising:

providing a threshold wall width;

providing at least one sliced layer polyline of the computer-aided design model to the computer, the at least one sliced layer polyline comprising:

a first vertex interconnecting a first segment and a second segment; and a second vertex interconnecting a third segment and a fourth segment;

determining, by the computer, a first minimum distance between the first vertex and the first and second segments;

determining, by the computer, a second minimum distance between the second vertex and the third and fourth segments;

adjusting, by the computer, a location of the first vertex if the first minimum distance is less than the threshold wall width; and adjusting, by the computer, a location of the second vertex if the second minimum distance is less than the threshold wall width, wherein an adjusted distance between the adjusted first vertex and the adjusted second vertex is about equal to the threshold wall width, or greater.

15. The method of claim 14, wherein the threshold wall width ranges from about 150% of a road width of build material deposited from a layered deposition system to about 200% of the road width.

16. The method of claim 15, wherein the threshold wall width ranges from about 160% of the road width to about 180% of the road width.

17. The method of claim 14, wherein the threshold wall width is about equal to a road width of build material deposited from a layered deposition system.

18. The method of claim 14, wherein adjusting, by the computer, the location of the first vertex comprises:

generating a first adjustment vector for the first vertex as a function of the threshold wall width; and repositioning the first vertex based on the first adjustment vector.

19. The method of claim 18, wherein adjusting, by the computer, the location of the second vertex comprises:

generating a second adjustment vector for the second vertex as a function of the threshold wall width; and repositioning the second vertex based on the second adjustment vector.

20. The method of claim 14, wherein the at least on sliced layer polyline comprises a first polyline and a second polyline, and wherein the first vertex is located on the first polyline and the second vertex is located on the second polyline.

* * * * *